US009555607B2

(12) United States Patent
Taga et al.

(10) Patent No.: US 9,555,607 B2
(45) Date of Patent: Jan. 31, 2017

(54) TAPE STICKING APPARATUS

(75) Inventors: Yoichiro Taga, Tokyo (JP); Kazumasa Nishiwaki, Tokyo (JP)

(73) Assignee: NEC ENGINEERING, LTD., Tokyo (JP)

(*) Notice: Subject to any disclaimer, the term of this patent is extended or adjusted under 35 U.S.C. 154(b) by 448 days.

(21) Appl. No.: 14/115,616

(22) PCT Filed: Jun. 28, 2012

(86) PCT No.: PCT/JP2012/004186
§ 371 (c)(1),
(2), (4) Date: Nov. 4, 2013

(87) PCT Pub. No.: WO2013/005398
PCT Pub. Date: Jan. 10, 2013

(65) Prior Publication Data
US 2014/0083617 A1    Mar. 27, 2014

(30) Foreign Application Priority Data

Jul. 1, 2011    (JP) .................................. 2011-147018

(51) Int. Cl.
*B32B 37/10*    (2006.01)
*H01L 21/67*    (2006.01)
*H01L 21/683*    (2006.01)

(52) U.S. Cl.
CPC ..... *B32B 37/1009* (2013.01); *H01L 21/67092* (2013.01); *H01L 21/67132* (2013.01);
(Continued)

(58) Field of Classification Search
CPC .. B32B 37/1009; B32B 37/10; B32B 37/1018; H01L 21/67132; B29C 70/44; B30B 9/22; B30B 5/02
See application file for complete search history.

(56) References Cited

U.S. PATENT DOCUMENTS 4,421,589 A * 12/1983 Armini ................... B32B 39/00
                                                    100/319
6,917,099 B2    7/2005 Hellekson et al.
(Continued)

FOREIGN PATENT DOCUMENTS

JP    2003-243550 A    8/2003
JP    2005-26377 A    1/2005
(Continued)

OTHER PUBLICATIONS

Machine translation of JP 2006-310338.*
International Search Report (ISR) (PCT Form PCT/ISA/210), in PCT/JP2012/004186, dated Sep. 4, 2012.

*Primary Examiner* — Christopher Schatz
(74) *Attorney, Agent, or Firm* — McGinn IP Law Group, PLLC.

(57) ABSTRACT

A tape sticking apparatus includes a rubber sheet that partitions an airtight space formed above a chamber into first and second airtight spaces and, a tape frame that holds a tape above the rubber sheet, and a supply/exhaust mechanism that switches between pressurizing and depressurizing by supplying gas to or sucking gas from the first and second airtight spaces. The gas supply/exhaust mechanism includes a first flow-rate control valve that controls the flow rate of sucked gas when the first airtight space is depressurized, and a second flow-rate control valve that controls the flow rate of supplied when the first airtight space is pressurized.

20 Claims, 18 Drawing Sheets

(52) U.S. Cl.
CPC  *H01L 21/6836* (2013.01); *H01L 2221/68327* (2013.01); *H01L 2221/68381* (2013.01)

(56) References Cited

U.S. PATENT DOCUMENTS

| | | | |
|---|---|---|---|
| 7,065,867 | B2 | 6/2006 | Kim et al. |
| 2003/0104651 | A1 | 6/2003 | Kim et al. |
| 2005/0045974 | A1 | 3/2005 | Hellekson et al. |
| 2011/0259515 | A1* | 10/2011 | Rotter .................. B29C 70/382 156/285 |

FOREIGN PATENT DOCUMENTS

| | | |
|---|---|---|
| JP | 2005-72593 A | 3/2005 |
| JP | 2005-129678 A | 5/2005 |
| JP | 2006-310338 A | 11/2006 |
| JP | 4143488 B2 | 9/2008 |
| JP | 2009-71145 A | 4/2009 |
| JP | 2011-71472 A | 4/2011 |

\* cited by examiner

TAPE STICKING APPARATUS

TECHNICAL FIELD

The present invention relates to a tape sticking apparatus for sticking dicing tape on a semiconductor wafer and so on. In particular, the present invention relates to an apparatus suitable for sticking tape on a sticking target object having a fragile structure.

BACKGROUND ART

Conventionally, when dicing tape is to be stuck on a semiconductor wafer in a semiconductor manufacturing process, for example, a wafer 42 is placed on a pedestal 41 and tape 43 is stuck on the wafer 42 by pressing the tape 43 from above by using a roller 44 with rubber adhered on its surface, a cylindrical block, or the like as shown in FIG. 17. However, there has been a problem in this method that since the process is carried out in the atmosphere, air tends to be trapped between the wafer 42 and the tape 43, and if the dicing is carried out (i.e., the chip is divided) in that state, cracking and chipping occur.

Therefore, a sticking apparatus that sticks tape under vacuum has been proposed. For example, as shown in FIG. 18, Patent literature 1 discloses a tape sticking apparatus 50 including a chamber 52 having an airtight space 51 formed therein, a rubber sheet 56 that divides the airtight space 51 into first and second airtight spaces 53 and 54, a frame pedestal 58 that holds tape 57 above the rubber sheet 56, and first and second air-flow passages 59 and 60 that are used to switch the air-pressure state of the first and second airtight spaces 53 and 54 between vacuum/atmospheric states, in which a wafer 55 is placed on the top surface of the rubber sheet 56.

In the tape sticking apparatus 50, the first and second airtight spaces 53 and 54 are first brought into a vacuum state, and then only the second airtight space 54 is switched to an atmospheric state, thereby generating a pressure difference between the first and second airtight spaces 53 and 54. As a result, the rubber sheet is inflated and the wafer 55 is pushed upward, thereby bringing the wafer 55 into contact with the adhesive surface (rear surface) of the tape 57. This tape sticking apparatus 50 makes it possible to stick the tape 57 on the wafer 55 under vacuum and thereby to prevent air from being trapped therebetween.

CITATION LIST

Patent Literature

Patent literature 1: Japanese Patent No. 4143488

SUMMARY OF INVENTION

Technical Problem

In recent years, as a result of the reduction in size of electronic apparatuses and the like, ultra-thin semiconductor chips for which the miniaturization of circuits has advanced have become widespread. Further, as a matter of course, the reduction in thickness of wafers, which are used for such semiconductor chips, is also rapidly advancing. Such thin wafers naturally have a low strength and thus tend to be warped. Therefore, there has been a problem that they are extremely weak against a vertical pressure and an impact, and cracking and chipping may occur when tape is stuck on the wafer. Accordingly, it has been desired to develop a sticking apparatus capable of, in addition to preventing air from being trapped between the wafer and the tape, reducing the load that is exerted on the wafer when tape is stuck on the wafer.

Further, recently, use of wafers on which fragile structures such as MEMS (Micro Electro Mechanical Systems) are mounted (hereinafter called "MEMS wafers") have become widespread. As a MEMS wafer, as shown in FIG. 19A, for example, there is a wafer 9 in which a thin-film 31A is attached so as to cover a recessed section formed in the wafer 9 and an airtight space 32A is thereby formed inside the wafer 9. Further, as a MEMS wafer like this, there is a wafer 9 in which a through-hole(s) is formed in a part of the thin-film 31A or the wafer 9 so that air can move between the airtight space 32A and the external space. Further, as shown in FIG. 20A, for example, there is a wafer 9 in which a thin-film 31B is attached so as to cover one of the mouths of an opened section formed through the wafer 9.

It should be noted that the following problem occurs when tape 57 is stuck on the MEMS wafer shown in FIG. 19 or FIG. 20 by using the tape sticking apparatus 50 disclosed in Patent literature 1.

In the tape sticking apparatus 50, firstly, a MEMS wafer is placed on the rubber sheet 56 and the first airtight space 53 is depressurized by sucking air from the first airtight space 53. However, in the case where a MEMS wafer shown in FIG. 19A in which a through-hole(s) is formed in a part of the thin-film 31A or the wafer 9, or a MEMS wafer shown in FIG. 20A is used, when air is rapidly sucked from the first airtight space 53, the speed of the air flowing out from the first airtight space 53 becomes very high. As a result, there is a risk that the thin-film 31A or 31B vibrates and is broken due to the air movement of the first airtight space 53.

Further, in the tape sticking apparatus 50, the first airtight space 53 is brought into a vacuum state by sucking air from the first airtight space 53. However, in the case where a MEMS wafer in which no through-hole is formed in either the thin-film 31 or the wafer 9 is used, a pressure difference is generated between the airtight space 32A formed in the MEMS wafer and the first airtight space 53 due to the suction of air from the first airtight space 53. Therefore, as shown in FIG. 19B, the air of the airtight space 32A expands and a pressure is exerted on the thin-film 31A from the airtight space 32A side. As a result, the think film 31A is pushed upward to the first airtight space 53 side. Then, when the pressure exerted on the thin-film 31A from the airtight space 32A side reaches the limit, the thin-film 31A may be broken.

Further, when tape 57 is to be attached on the MEMS wafer shown in FIG. 20A, the tape 57 is attached so as to cover the other mouth of the opened section formed through the wafer 9 in the evacuated first airtight space 53. As a result, the opened section of the MEMS wafer is covered by the thin-film 31B and the tape 57, thereby forming an evacuated airtight space 32B.

In this state, when the pressure of the first airtight space 53 is increased to the atmospheric pressure by supplying air to the first airtight space 53, a pressure difference is generated between the airtight space 32B and the first airtight space 53. Therefore, as shown in FIG. 20B, a pressure is exerted on the thin-film 31A from the first airtight space 53 side and the thin-film 31B is deflated (i.e., bent) toward the airtight space 32B side. Then, when the pressure exerted on the thin-film 31B from the first airtight space 53 side reaches the limit, the thin-film 31B may be broken.

As described above, there is a problem that when tape 57 is stuck on a MEMS wafer by using the tape sticking apparatus 50 disclosed in Patent literature 1, there is a risk that a fragile structure mounted on the MEMS wafer could be broken when the pressure state for the first airtight space 53 is changed between that before and that after the sticking process of the tape 57.

Accordingly, the present invention has been made in view of the above-described problems in the related art, and an object thereof is to provide a tape sticking apparatus capable of, when tape is stuck on a sticking target object including a fragile structure mounted thereon, reducing the load for the sticking target object and thereby preventing the sticking target object from being broken or damaged.

Solution to Problem

To achieve the above-described object, the present invention includes: a vessel with an airtight space formed therein; an elastic sheet that partitions the airtight space into an upper-located first airtight space and a lower-located second airtight space, a tape sticking target object being placed on the first airtight space side; a tape hold member that holds tape inside the first airtight space and positions the tape a predetermined distance away from the tape sticking target object placed on the elastic sheet; and air-pressure switching means for switching between pressurizing and depressurizing by supplying or sucking gas to or from the first and second airtight spaces, in which after the first and second airtight spaces are depressurized and thereby evacuated, the tape sticking target object is stuck on the tape by pressurizing the second airtight space, inflating the elastic sheet, and pushing the tape sticking target object upward; and the elastic sheet is deflated by pressuring the first airtight space, in which the air-pressure switching means includes: first flow-rate control means for, when gas is sucked from the first airtight space, controlling a flow rate of the gas; and second flow-rate control means for, when gas is supplied to the first airtight space, controlling a flow rate of the gas, and in which when the first airtight space is depressurized, the gas is sucked from the first airtight space while controlling its flow rate by using the first flow-rate control means, and when the first airtight space is pressurized, the gas is supplied to the first airtight space while controlling its flow rate by using the second flow-rate control means.

Further, according to the present invention, before tape is stuck on the sticking target object, when the first airtight space is depressurized, gas is sucked from the first airtight space while controlling its flow rate. Further, after the tape is stuck on the sticking target object, when the first airtight space is pressurized, gas is supplied to the first airtight space while controlling its flow rate. Therefore, it is possible to prevent the fragile structure mounted on the sticking target object from being broken or damaged due to the gas movement.

The above-described tape sticking apparatus may further include vacuum-level detection means for detecting a vacuum level of the first airtight space, and the first airtight space may be depressurized until the vacuum level of the first airtight space reaches a predetermined vacuum level.

In the above-described tape sticking apparatus, a first internal airtight space may be formed in the tape sticking target object, and the predetermined vacuum level may be such a vacuum level that the tape sticking target object is not broken due to a pressure difference between the first internal airtight space and the first airtight space caused by the depressurizing of the first airtight space. As a result, it is possible to prevent the fragile structure mounted on the sticking target object from being broken or damaged when the first airtight space is depressurized.

In the above-described tape sticking apparatus, a second internal airtight space may be formed in the tape sticking target object by the sticking of the tape, and the predetermined vacuum level may be such a vacuum level that the tape sticking target object is not broken due to a pressure difference between the second internal airtight space and the first airtight space caused by the pressurizing of the first airtight space. As a result, it is possible to prevent the fragile structure mounted on the sticking target object from being broken or damaged when the first airtight space is pressurized.

In the above-described tape sticking apparatus, the tape sticking target object may be stuck on the tape while controlling an amount of the pressurization of the second airtight space, thereby changing an inflating speed of the elastic sheet from a low speed to a high speed in a stepwise manner when the tape sticking target object is pushed upward. As a result, it is possible to stick the tape while minimizing the load for the sticking target object. Therefore, even if the sticking target object has low rigidity, the tape can be stuck while preventing the sticking target object from being broken or damaged.

In the above-described tape sticking apparatus, the elastic sheet may be inflated at a first speed until a contact area between the tape sticking target object and the tape reaches a predetermined size, and after that, an inflating speed of the elastic sheet may be switched to a second speed higher than the first speed and an entire sticking surface of the tape sticking target object may be brought into contact with the tape, the first speed being such a speed that the tape sticking target object can be pressed on the tape with a pressing pressure with which the tape sticking target object is not broken. As a result, it is possible to increase the stuck area between the sticking target object and the tape without exerting any excessive load on the sticking target object.

In the above-described tape sticking apparatus, before the elastic sheet is inflated at the first speed, the elastic sheet may be inflated at a third speed lower than the first speed and a central part of the tape sticking target object may be brought into contact with the tape. As a result, it is possible to reliably bring the sticking target object into contact with the tape while maintaining the posture and position of the sticking target object unchanged.

In the above-described tape sticking apparatus, the elastic sheet may be inflated at the third speed by evacuating the first and second airtight spaces and then blocking up the second airtight space while maintaining the first airtight space in the evacuated state.

In the above-described tape sticking apparatus, when the elastic sheet is inflated at the second speed, the tape sticking target object and the tape may be pushed upward and thereby pressed against a ceiling surface of the airtight space while maintaining the tape sticking target object and the tape in contact with each other. As a result, it is possible to straighten the warping of the sticking target object and to improve the adhesion between the sticking target object and the tape.

Advantageous Effects of Invention

As described above, according to the present invention, it is possible, when tape is stuck on a sticking target object including a fragile structure mounted thereon, to reduce the load for the sticking target object, to thereby prevent the sticking target object from being broken or damaged.

DESCRIPTION OF EMBODIMENTS

Next, exemplary embodiments for carrying out the present invention are explained with reference to the drawings.

Figure 1:
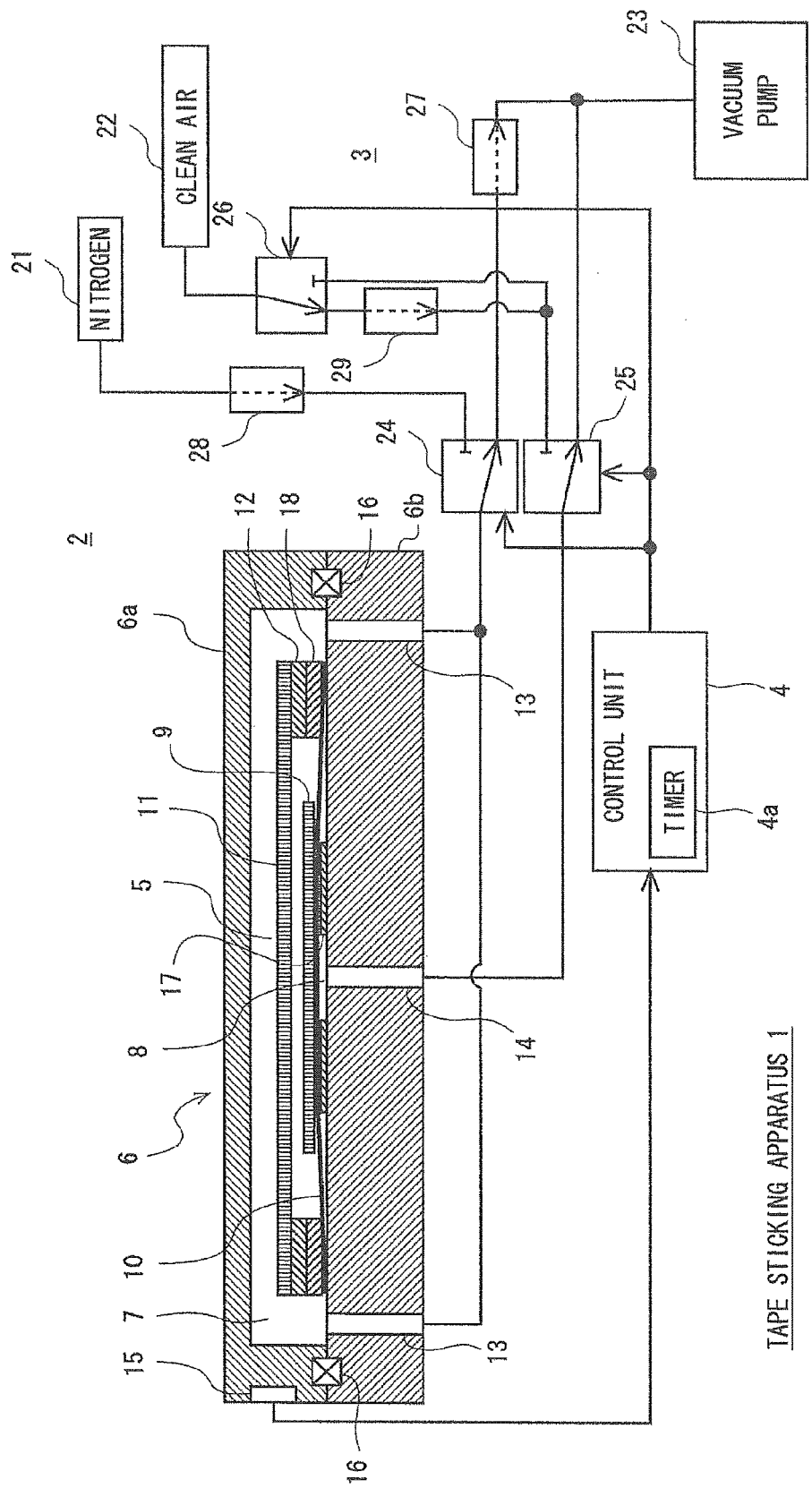
FIG. 1 is a cross section showing an exemplary embodiment of a tape sticking apparatus according to the present invention.

FIG. 1 shows an exemplary embodiment of a tape sticking apparatus according to the present invention. This tape sticking apparatus 1 is roughly composed of an apparatus main body 2, a supply/exhaust mechanism 3 that supplies air (clean air) and nitrogen to the apparatus main body 2 and sucks air and the like from the apparatus main body 2, and a control unit 4 that controls the supply/exhaust timing of air and the like.

The apparatus main body 2 is an apparatus for performing a sticking operation, and is formed, for example, in a cylindrical shape. This apparatus main body 2 includes a chamber (vessel) 6 having an airtight space 5 formed therein, a rubber sheet 10 that partitions the airtight space 5 into first and second airtight spaces 7 and 8, a tape frame 12 that holds tape 11 above the rubber sheet 10, a first supply/exhaust pipe 13 that supplies nitrogen to the first airtight space 7 and sucks air from the first airtight space 7, a second supply/exhaust pipe 14 that supplies air to the second airtight space 8 and sucks air from the second airtight space 8, and a vacuum-level sensor 15 that detects the vacuum level of the airtight space 5. Further, a disk-shaped wafer 9 is placed on the top surface of the rubber sheet 10.

The chamber 6 is composed of two divided sections, i.e., an upper chamber (upper lid) 6a and a lower chamber (pedestal) 6b. A recessed section that is recessed upward is formed inside the upper chamber 6a. A seal ring 16 for ensuring the airtightness of the airtight space 5 is disposed between the upper and lower chambers 6a and 6b.

Figure 2A:
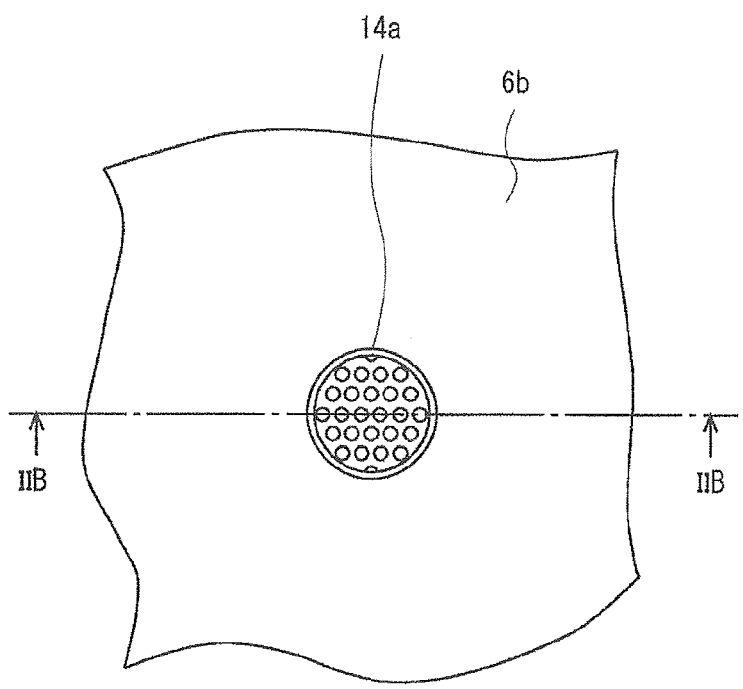
FIG. 2A is an enlarged top view showing an opening of a second supply/exhaust pipe shown in FIG. 1.
Figure 2B:
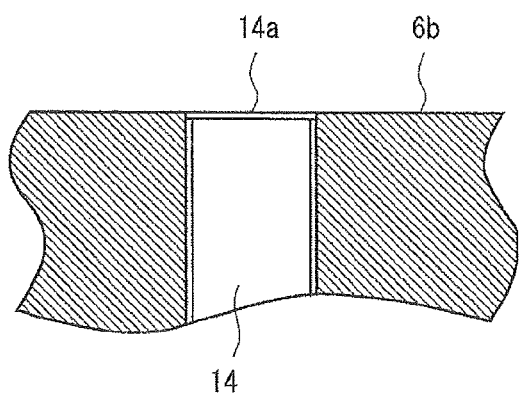
FIG. 2B is an enlarged cross section showing an opening of a second supply/exhaust pipe shown in FIG. 1, taken along the line IIB-IIB of FIG. 2A.

The above-described first and second supply/exhaust pipes 13 and 14 are laid inside the lower chamber 6b. Among these pipes, as shown in FIGS. 2A and 2B, a mesh cap 14a with a number of small holes formed therethrough is provided in the opening of the second supply/exhaust pipe 14. This mesh cap 14a is provided to increase the effective cross section (i.e., the diameter of the second supply/exhaust pipe 14) when air is sucked, while preventing the rubber sheet 10 (which is described later) from being sucked into the second supply/exhaust pipe 14.

Figure 3A:
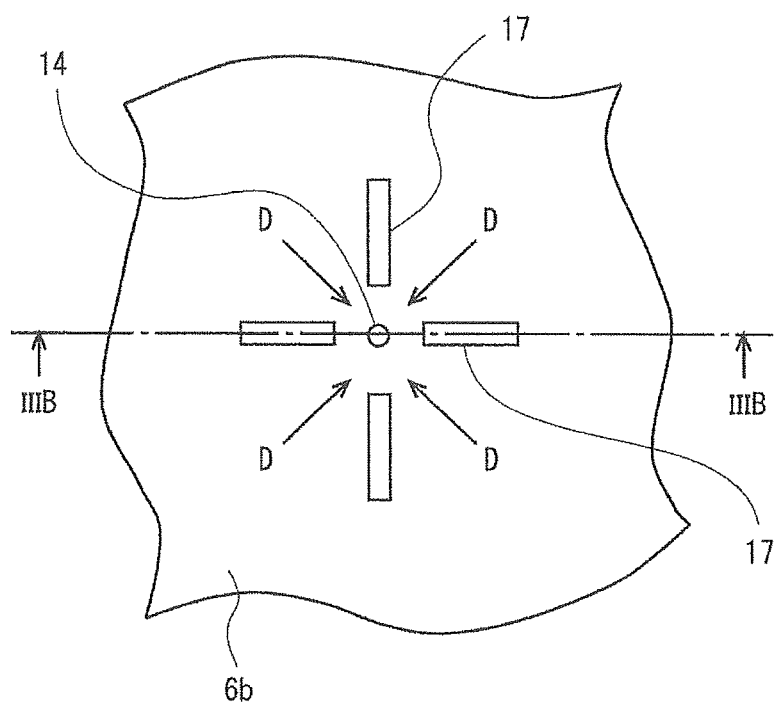
FIG. 3A is an enlarged top view showing a spacer shown in FIG. 1.
Figure 3B:
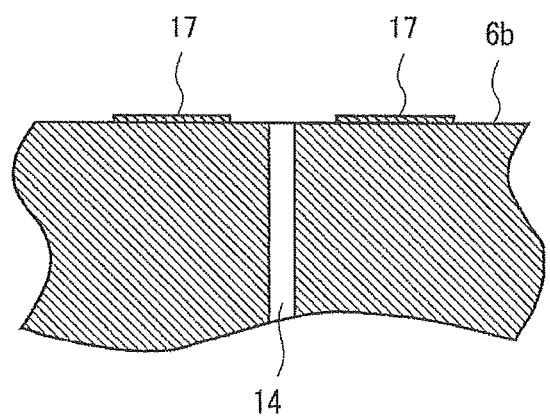
FIG. 3B is an enlarged cross section showing a spacer shown in FIG. 1, taken along the line IIIB-IIIB of FIG. 3A.

Further, as shown in FIG. 1, a plurality of spacers 17 having a predetermined height are formed on the top surface of the lower chamber 6b. As shown in FIGS. 3A and 3B, these spacers 17 are arranged in a cross-like configuration around the mouth of the second supply/exhaust pipe 14.

Further, as shown in FIG. 1, the elastic rubber sheet 10 is placed on the top surface of the lower chamber 6b. For example, the rubber sheet 10 is preferably formed from an elastic body having an excellent gas blocking property, such as chloroprene rubber and ethylene-propylene rubber. Note that the spacers 17 are preferably formed from material similar to that of the rubber sheet 10 in order to prevent damage to the rubber sheet 10.

Figure 4A:
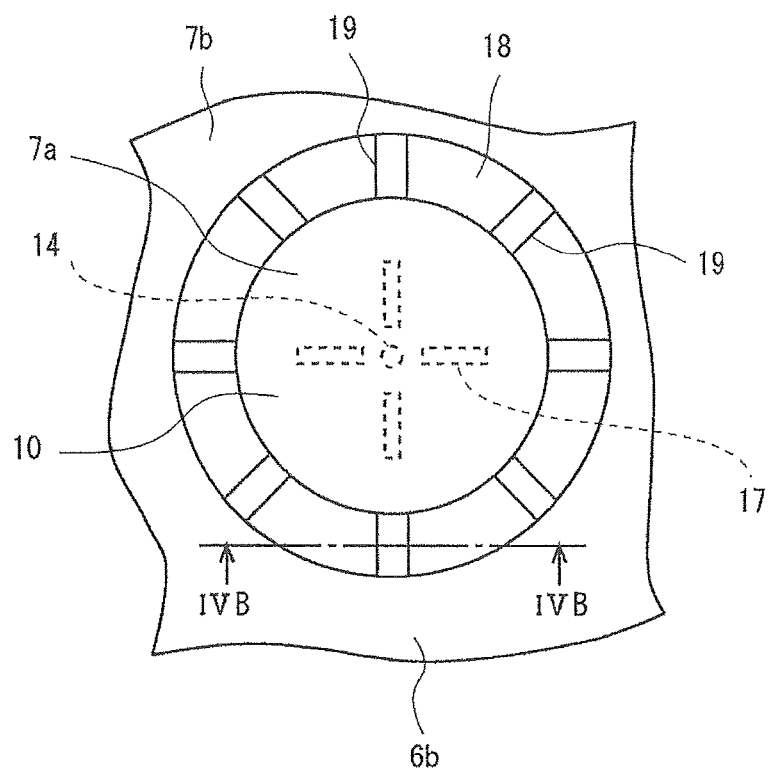
FIG. 4A is an enlarged top view showing a rubber sheet and a press ring shown in FIG. 1.
Figure 4B:
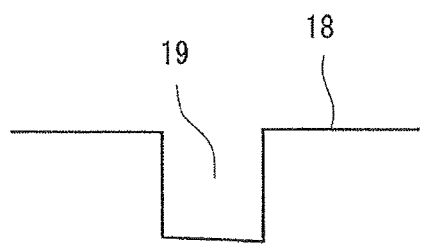
FIG. 4B is an enlarged diagram showing a rubber sheet and a press ring shown in FIG. 1, and is a cross section of the press ring taken along the line IVB-IVB of FIG. 4A.

As shown in FIGS. 4A and 4B, a press ring 18 having a ring shape as viewed from the top is placed above the periphery of the rubber sheet 10. The press ring 18 is screwed on the lower chamber 6b so that the rubber sheet 10 is fixed. A plurality of grooves 19 are formed in the press ring 18, and the space 7a inside the press ring 18 is connected with the space 7b outside the press ring 18 through these grooves 19. Note that the grooves 19 may be formed in the tape frame 12 (which is described later) instead of or in addition to the press ring 18.

As shown in FIG. 1, the tape frame 12 having a ring shape as viewed from the top is placed on the top surface of the press ring 18. The tape 11, whose rear surface is coated with an adhesive such as a UV (UltraViolet) curing resin and a thermosetting resin, is stuck on the top surface of the tape frame 12. The tape 11 is stuck with a certain tension, so that warping and wrinkles of the tape 11 are prevented.

Note that the sticking of the tape 11 is not limited to the sticking onto the top surface of the tape frame 12. For example, the tape 11 may be sandwiched from the front and rear by two frames. That is, any type of sticking methods can be used, provided that warping and wrinkles of the tape 11 are not caused.

Figure 19A:
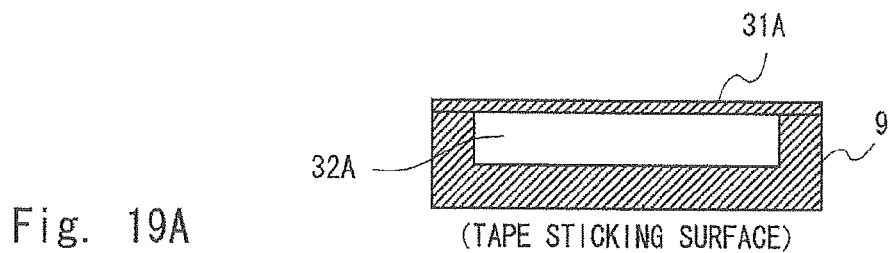
FIG. 19A is a rough diagram showing an example of an MEMS wafer.

The wafer 9 is, for example, a MEMS wafer including a fragile structure mounted thereon. As shown in FIG. 19A, a recessed section is formed by etching or the like and a thin-film 31A is attached so as to cover this recessed section. As a result, an airtight space 32A is formed inside the wafer 9. Note that a through-hole(s) may be formed in a part of the thin-film 31A and/or the wafer 9 so that gas can move between the airtight space 32A and the external space.

Figure 20A:
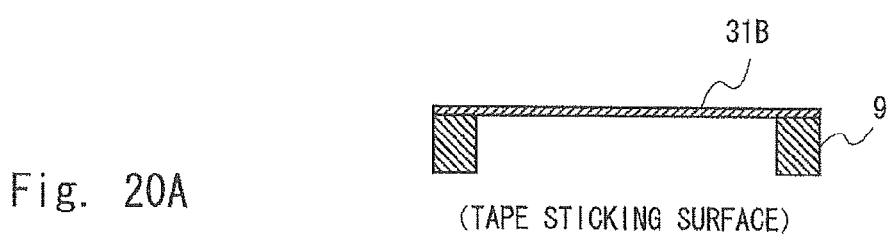
FIG. 20A is a rough diagram showing another example of an MEMS wafer.

Further, as the wafer 9, for example, a wafer 9 in which an opened section is formed through the wafer by etching or the like and a thin-film 31B is attached so as to cover one of the mouths of this opened section as shown in FIG. 20A may be used. In the wafers 9 shown in FIGS. 19A and 20A, the surfaces opposite to the surfaces on which the thin-films 31A and 31B are attached become the tape sticking surfaces.

The supply/exhaust mechanism 3 includes a nitrogen supply source 21 that supplies nitrogen, an air supply source 22 that supplies air, a vacuum pump 23 that sucks air and nitrogen, a first solenoid valve 24 disposed between the nitrogen supply source 21 and the vacuum pump 23 and the first supply/exhaust pipe 13, a second solenoid valve 25 disposed between the air supply source 22 and the vacuum pump 23 and the second supply/exhaust pipe 14, a third solenoid valve 26 disposed between the second solenoid valve 25 and the air supply source 22, a first flow-rate control valve 27 disposed between the first solenoid valve 24 and the vacuum pump 23, a second flow-rate control valve 28 disposed between the first solenoid valve 24 and the nitrogen supply source 21, and a third flow-rate control valve 29 disposed between the second solenoid valve 25 and the third solenoid valve 26.

The first solenoid valve 24 is provided to selectively connect the first supply/exhaust pipe 13 with the first flow-rate control valve 27 (vacuum pump 23) or the second flow-rate control valve 28 (nitrogen supply source 21). The second solenoid valve 25 is provided to selectively connect the second supply/exhaust pipe 14 with the third solenoid valve 26 or the vacuum pump 23. Further, the third solenoid valve 26 is provided to selectively connect the second supply/exhaust pipe 14 with the third flow-rate control valve 29 or the air supply source 22.

The first flow-rate control valve 27 is provided to control the flow rate of air or the like sucked by the vacuum pump 23, and the second flow-rate control valve 28 is provided to control the flow rate of nitrogen supplied from the nitrogen supply source 21. Further, the third flow-rate control valve 29 is provided to control the flow rate of air supplied from the air supply source 22.

The flow rate of the air or the like controlled by the first and second flow-rate control valves 27 and 28 can be changed according to the setting, and is set in advance when tape is stuck by the tape sticking apparatus 1. By controlling the flow rate of the air or the like to be sucked or supplied by using the first and second flow-rate control valve 27 and 28, the depressurizing/pressurizing speed of the first airtight space 7 can be changed.

The flow rate set by the first and second flow-rate control valves 27 and 28 can be set according to the state of the wafer 9 on which the tape 11 is to be stuck. For example, when an MEMS wafer including a fragile structure (thin-film 31A or 31B) mounted thereon, like the one shown in FIGS. 19A and 19B or FIGS. 20A and 20B is used as the wafer 9, the flow rate is set to such a flow rate that the fragile structure is not broken by the pressure caused by the supply/suction of air or the like. Note that the pressure at which the fragile structure is not broken changes depending on the resistance to pressure of the fragile structure that is determined based on its thickness, shape, and the like. Therefore, the flow rate during the actual operation is determined as appropriate according to the state of the wafer 9 to be used.

The control unit 4 is provided to control the actions of the first to third solenoid valves 24 to 26 according to the output of the vacuum-level sensor 15 and/or the output of a built-in timer 4a, and thereby to control the pressurization/depressurization of the first and second airtight spaces 7 and 8 of the apparatus main body 2.

Next, a sticking method using the tape sticking apparatus 1 having the above-described configuration is explained with reference to FIGS. 1 to 14. The sticking method is explained in accordance with the process procedure shown below. Note that in the following explanation, an example in which a UV-curing resin is used as the adhesive for the tape 11 is explained.
(1) Initial state
(2) Evacuating process
(3) Low-speed sticking process
(4) Medium-speed sticking process
(5) High-speed sticking process
(6) Stabilization process
(7) Rubber deflation process
(8) Rubber flattening process
(1) Initial State Firstly, in FIG. 1, the second solenoid valve 25 is opened to the vacuum pump 23 side and the second airtight space 8 (airtight space located below the rubber sheet 10) is thereby brought into a depressurized atmosphere state. In that state, the upper chamber 6a is opened and the wafer 9 is placed on the center of the top surface of the rubber sheet 10 in such a manner that its tape sticking surface faces upward. Next, the rear surface (adhesive surface) of the tape 11 is stuck on the top surface of the tape frame 12, and the tape frame 12, on which the tape 11 was stuck, is placed on the press ring 18.
(2) Evacuating Process After the upper chamber 6a is closed, as shown in FIG. 6, the first solenoid valve 24 is opened to the vacuum pump 23 side and the first supply/exhaust pipe 13 is thereby connected to the vacuum pump 23 through the first flow-rate control valve 27. In this manner, the first airtight space 7 (airtight space located above the rubber sheet 10) is brought into a depressurized atmosphere state by sucking air from the first airtight space 7 while controlling its flow rate by using the first flow-rate control valve 27 (step S1 in FIG. 5).

Figure 19B:
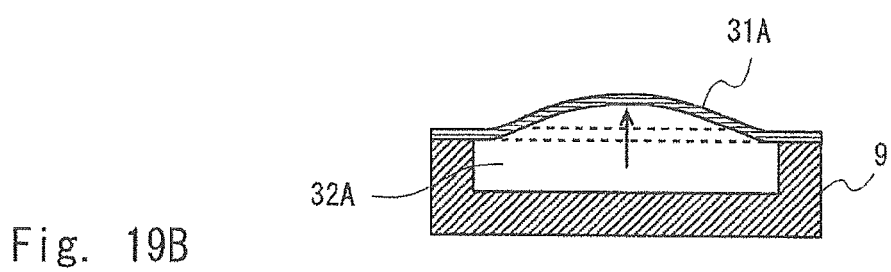
FIG. 19B is a rough diagram showing an example of an MEMS wafer.

Note that when the MEMS wafer shown in FIGS. 19A and 19B is used as the wafer 9, this evacuating process causes a pressure difference between the airtight space 32A formed in the wafer 9 and the first airtight space 7. Therefore, a load is exerted on the thin-film 31A, which is a fragile structure, and thus the thin-film 31A may be broken. Therefore, in this exemplary embodiment, the vacuum level of the first airtight space 7 is detected by the vacuum-level sensor 15, and the first airtight space 7 is depressurized in such a manner that the detected vacuum level does not exceed a predetermined vacuum level that is defined in advance.

When an MEMS wafer shown in FIGS. 19A and 19B or FIGS. 20A and 20B is used as the wafer 9, the pre-defined vacuum level may be such a vacuum level that the fragile structure (thin-film 31A or 31B) is not broken by the pressure difference caused by the vacuum-level difference between the airtight space 32A or 32B formed in the MEMS wafer and the first airtight space 7 in the above-described evacuating process or the rubber deflation and flattening process (which is described later). Note that the vacuum level at which the fragile structure is not broken changes depending on its thickness, shape, and the like. Therefore, the vacuum level during the actual operation is determined as appropriate according to the state of the wafer 9 to be used.

Figure 7:
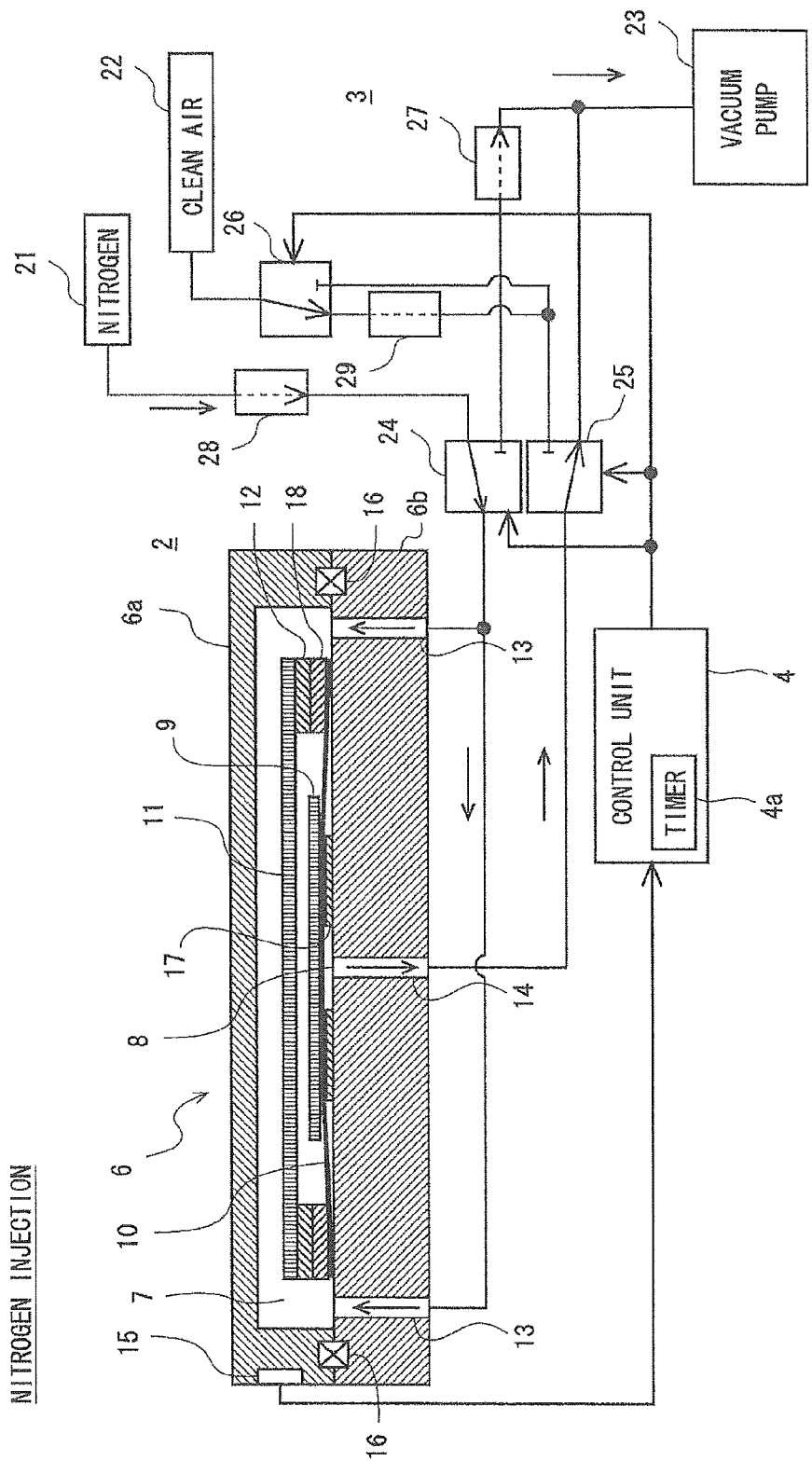
FIG. 7 is a flow diagram of a tape sticking process, and shows a nitrogen injection process.

Note that as shown in FIG. 7, nitrogen is injected to the first airtight space 7 while controlling its flow rate through the second flow-rate control valve 28 by intermittently opening the first solenoid valve 24 to the second flow-rate control valve 28 side. As described above, the flow rate of air or the like sucked from or supplied to the first airtight space 7 is controlled by using the first and second flow-rate control valves 27 and 28. This is because, by doing so, the fragile structure mounted on the wafer 9 is prevented from being broken due to the rapid movement of the air or the like from or to the first airtight space 7 as explained above in the Background Art section.

Further, the reason why nitrogen is injected to the first airtight space 7 is that the injection of nitrogen lowers the concentration of oxygen and thus facilitates the sticking process under the environment having the lowered oxygen concentration. The UV-curing resin is strongly anaerobic. Therefore, when the sticking is carried out in an environment having a high oxygen concentration, the curing effect is lowered. As a result, when the UV-curing resin is irradiated with UV-light in a later process, part of the UV-curing resin remains uncured. In that case, when the wafer 9 (chips) is removed from the tape 11 after the dicing process, the chips cannot be easily removed from the tape 11. Therefore, as described above, the oxygen concentration in the first airtight space 7 is lowered by injecting nitrogen into the first airtight space 7, thereby preventing the curing effect of the UV-curing resin from being lowered.

Figure 8:
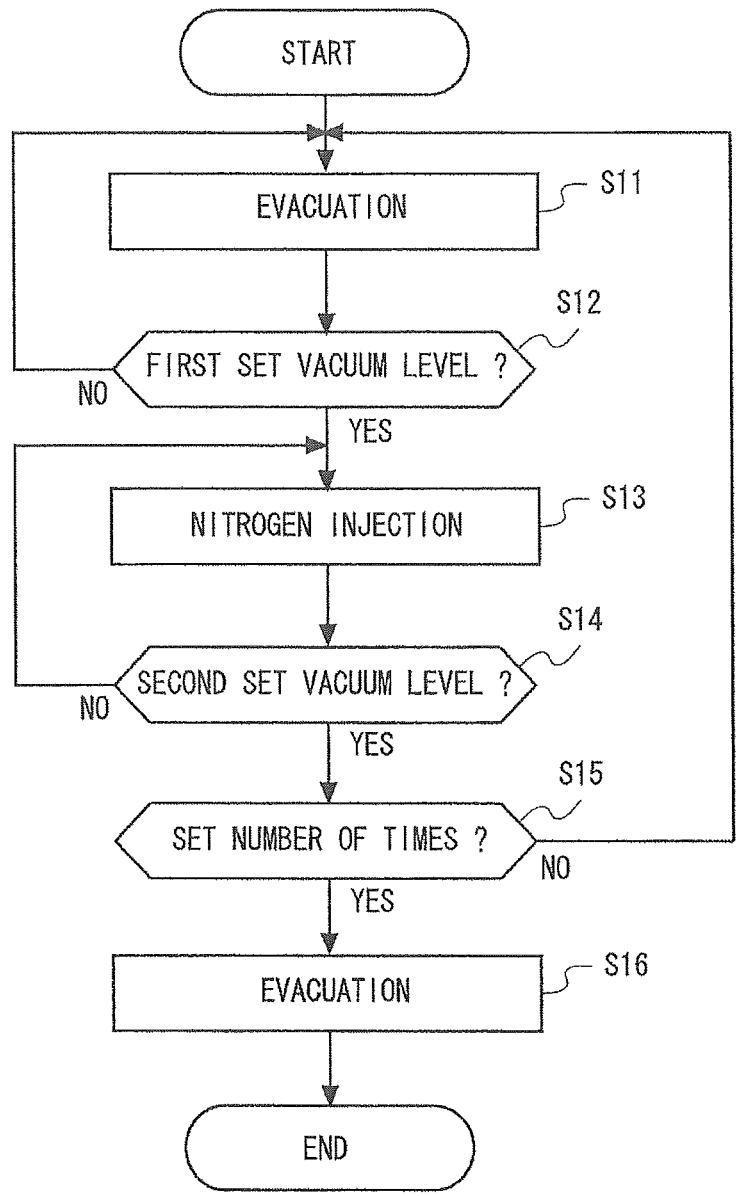
FIG. 8 is a sub-flowchart showing a nitrogen injection procedure performed in an evacuating process.

The nitrogen injection process can be carried out in accordance with a flowchart shown in FIG. 8. In particular, when the vacuum level of the first airtight space 7 reaches a first set vacuum level while sucking air from the first airtight space 7, the first supply/exhaust pipe 13 is connected to the nitrogen supply source 21 and nitrogen is thereby injected into the first airtight space 7 (steps S11 to S13). Then, the nitrogen injection is continued until the vacuum level of the first airtight space 7 reaches a second set vacuum level. Then, when the vacuum level reaches the second set vacuum level, it is determined whether or not the number of times of nitrogen injections reaches a set number of times (steps S14 and S15). As a result of the determination, if the number of times of nitrogen injections reaches the set number of times, the nitrogen is sucked by performing an evacuating process again (step S16) and the first airtight space 7 is thereby brought into a depressurized atmosphere state while keeping the concentration of the residual oxygen at no more than 1%. Note that the first and second set vacuum levels can be arbitrarily determined within the above-described predetermined vacuum level range. Further, the set number of times can also be arbitrarily determined.

Note that the nitrogen injection process is carried out in consideration of the property of the UV-curing resin. Therefore, when an adhesive other than the UV-curing resin is used, the nitrogen injection process can be omitted.

(3) Low-Speed Sticking Process

Figure 9:
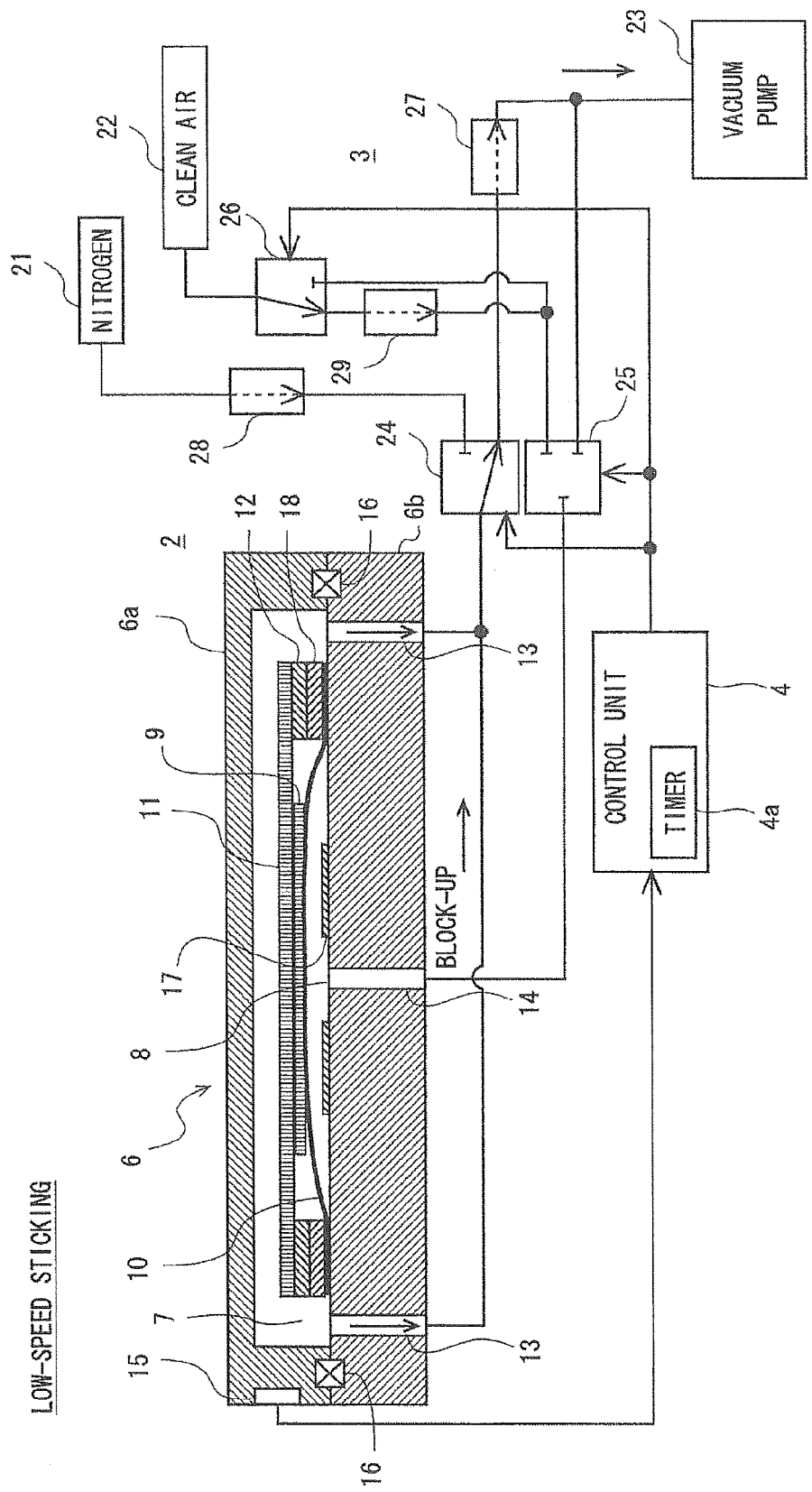
FIG. 9 is a flow diagram of a tape sticking process, and shows a low-speed sticking process.

Next, as shown in FIG. 9, the second airtight space 8 is hermetically sealed by closing the second solenoid valve 25 and thereby blocking up the second supply/exhaust pipe 14, while maintaining the vacuum of the first airtight space 7. In this state, a natural leakage occurs in the second airtight space 8 and a small amount of air flows into the second airtight space 8. Therefore, a slight pressure difference occurs between the first and second airtight spaces 7 and 8.

As a result, the rubber sheet 10 inflates slowly and thereby slowly pushes up the wafer 9 placed above the rubber sheet 10. By this slow pushing-up process, the wafer 9 is brought into contact with the adhesive surface of the tape 11 (step S2 in FIG. 5) in such a manner that the center of the wafer 9 comes into contact with the tape 11 before the other part of the wafer 9.

That is, in the case where the wafer 9 is placed on an unstable foundation such as the rubber sheet 10, if the wafer 9 is pushed up at a high speed, the posture of the wafer 9 tends to be disturbed and thereby inclined. Further, the wafer 9 tends to slide on the rubber sheet 10 and thereby change its position. In contrast, by slowly pushing up the wafer 9, the wafer 9 can be brought into contact with the tape 11 while maintaining the posture and position of the wafer 9 unchanged. Therefore, it is possible to reliably stick the wafer 9, starting from the center of the wafer 9.

(4) Medium-Speed Sticking Process

Figure 10:
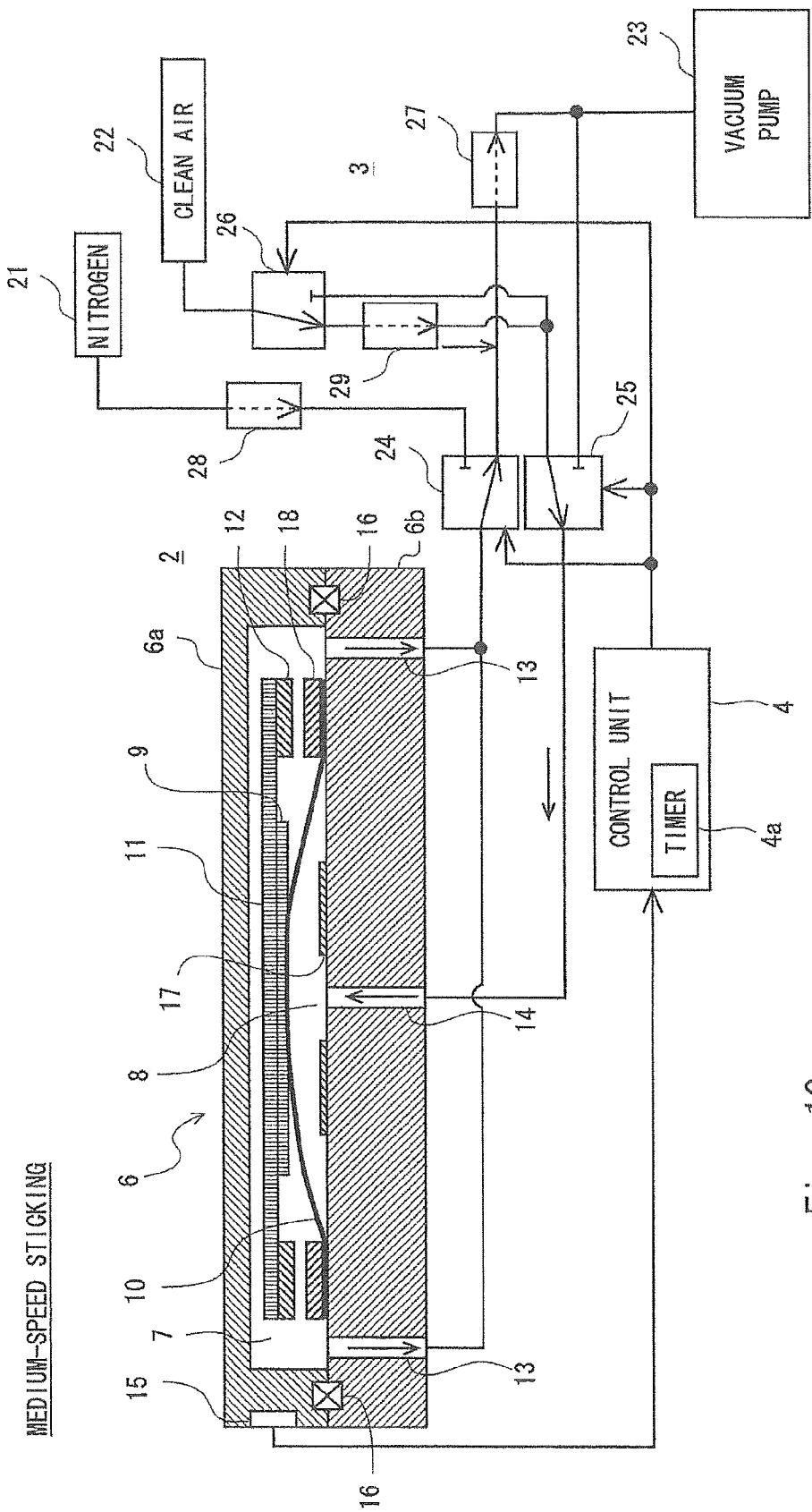
FIG. 10 is a flow diagram of a tape sticking process, and shows a medium-speed sticking process.

Next, as shown in FIG. 10, air is supplied to the second supply/exhaust pipe 14 while controlling its flow rate, by opening the second solenoid valve 25 to the air supply source 22 side and opening the third solenoid valve 26 to the third flow-rate control valve 29 side. As a result, the second airtight space 8 is brought into a pressurized atmosphere state and the pressure difference between the first and second airtight spaces 7 and 8 is thereby increased. Consequently, the inflating speed of the rubber sheet 10 is changed from the low speed to the medium speed (step S3 in FIG. 5).

In this medium-speed sticking process, the inflating speed of the rubber sheet 10 is lower and the pushing-up pressure for the wafer 9 is lower in comparison to those in the high-speed sticking process (which is described later). In this process, the pushing-up of the wafer 9 to the tape 11 is performed at a low pressure so that the stuck area between the tape 11 and the wafer 9 is increased without exerting any excessive load on the wafer 9.

In the area in which the wafer 9 is in contact with the tape 11, since the tape 11 is stuck on the wafer 9 and thereby reinforces the wafer 9, cracking and chipping of the wafer 9 are prevented. This process is performed to increase the reinforced area as described above while minimizing the load on the wafer 9. Therefore, the tape 11 and the tape frame 12 are pushed up together with the wafer 9 and, for example, 50% to 70% of the top surface of the wafer 9 is brought into contact with the tape 11.

Note that the inflating speed (inflating pressure) of the rubber sheet 10 in the medium-speed sticking process is set to such a speed (inflating pressure) that the wafer 9 can be pressed on the tape 11 at a pressing pressure with which the wafer 9 is not broken. However, the pressing pressure with which the wafer 9 is not broken changes depending on its thickness, shape (warping state), and the like. Therefore, the sticking speed during the actual operation is determined as appropriate according to the state of the wafer 9 to be used.

(5) High-Speed Sticking Process

Figure 11:
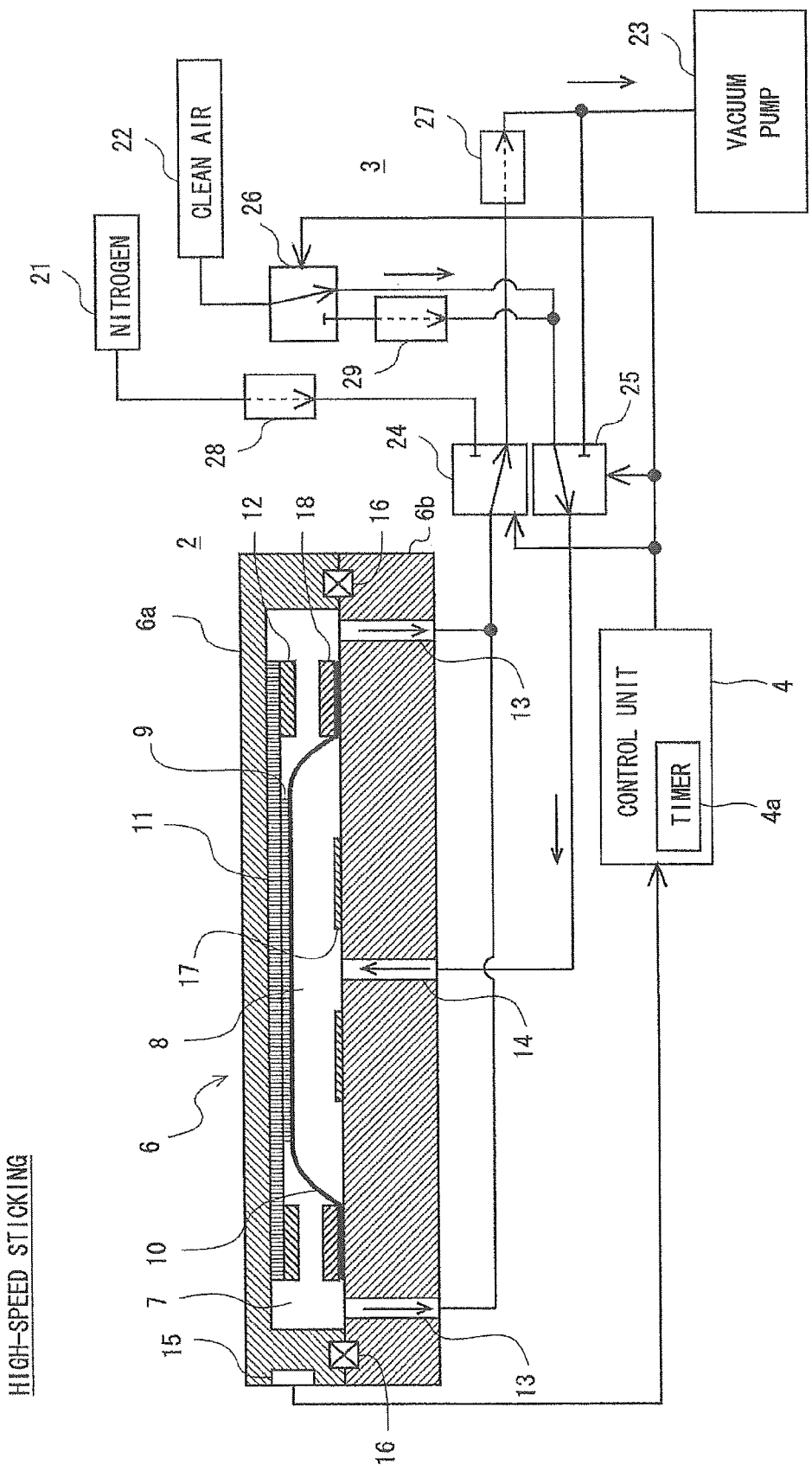
FIG. 11 is a flow diagram of a tape sticking process, and shows a high-speed sticking process.

When the stuck area reaches 50% to 70% of the top surface of the wafer and the risk of cracking and chipping of the wafer 9 is thereby lowered, the pressure difference between the first and second airtight spaces 7 and 8 is further increased by opening the third solenoid valve 26 to the second solenoid valve 25 side as shown in FIG. 11. As a result, the inflating speed of the rubber sheet 10 is changed from the medium speed to the high speed (step S4 in FIG. 5) and the pressing pressure of the wafer 9 to the tape 11 is thereby increased. The entire top surface of the wafer 9 is stuck on the tape 11 through this high-speed sticking process.

Further, in the high-speed sticking process, the tape 11 and the wafer 9 are pressed against the ceiling surface of the upper chamber 6a, so that the warping of the wafer 9 is straightened and the adhesion between the wafer 9 and the tape 11 is improved. Note that since the tape 11 functions as a protection member for protecting the top surface of the wafer 9, the surface of the wafer 9 is not damaged.

As described above, in the tape sticking apparatus 1, when the wafer 9 is stuck on the tape 11, the sticking process is performed while changing the inflating speed of the rubber sheet 10 from the low speed to the high speed in a stepwise manner. Therefore, the sticking process can be performed while minimizing the load on the wafer 9. As a result, even if the wafer 9 has low rigidity, the tape 11 can be stuck on the wafer 9 while preventing the wafer 9 from being broken or damaged.

Further, in the tape sticking apparatus 1, since the center of the wafer 9 is brought into contact with the tape 11 before the other part of the wafer 9 by performing the low-speed sticking process, the wafer 9 can be stuck on the tape 11 in an orderly fashion from the center toward the periphery thereof in the subsequent medium-speed and high-speed sticking processes. Therefore, even if air is present between the wafer 9 and the tape 11, the wafer 9 can be stuck on the wafer 9 while letting the air escape to the outside, thus making it possible to prevent air from being trapped between the wafer 9 and the tape 11.

Note that above-described switching among the low-speed, medium-speed and high-speed sticking processes can be performed by automatic control. For example, the tape sticking apparatus can be configured so that the sticking speed is switched according to the elapsed time by using a timer 4a incorporated in the control unit 4.

(6) Stabilization Process

Figure 12:
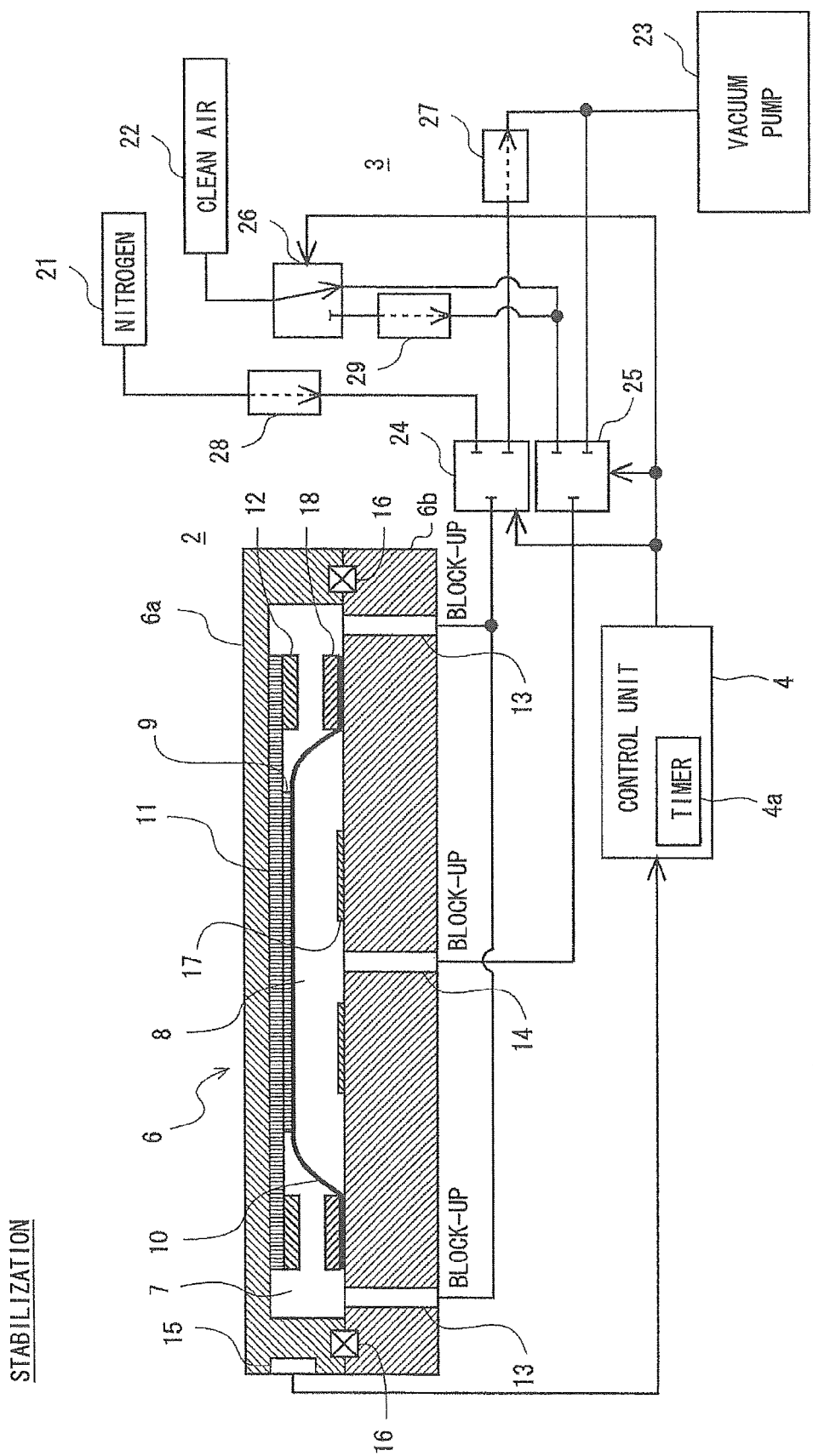
FIG. 12 is a flow diagram of a tape sticking process, and shows a stabilization process.

Next, as shown in FIG. 12, the first and second airtight spaces 7 and 8 are hermetically sealed by closing the first and second solenoid valves 24 and 25 \, thereby blocking up the first and second supply/exhaust pipes 13 and 14. In this way, the pressing state of the wafer 9 and the tape 11 is maintained over a predetermined time and the adhesion between the tape 11 and the wafer 9 is thereby stabilized (step S5 in FIG. 5).

(7) Rubber Deflation Process

Figure 13:
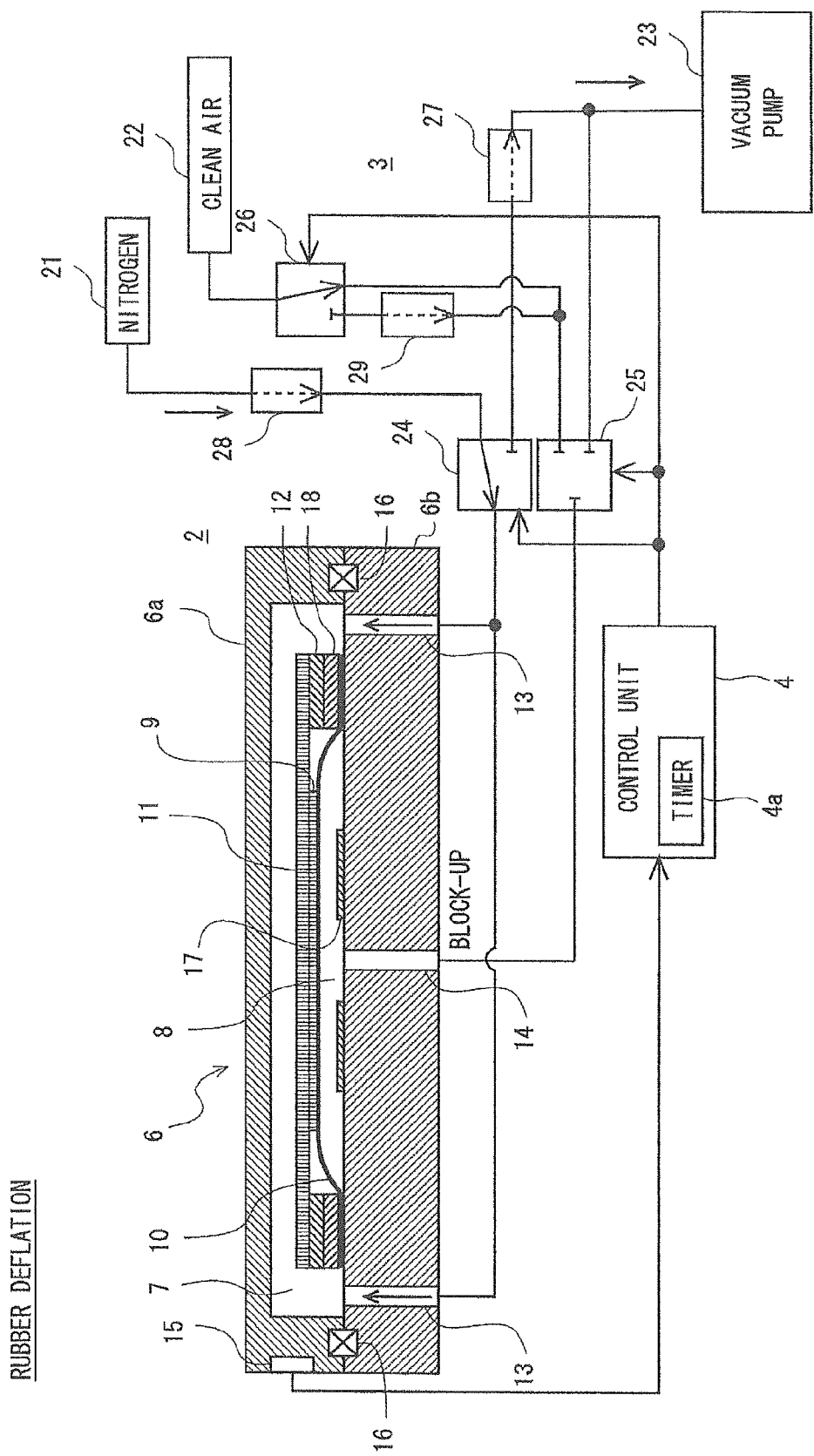
FIG. 13 is a flow diagram of a tape sticking process, and shows a rubber deflation process.

Next, as shown in FIG. 13, nitrogen is supplied to the first airtight space 7 through the second flow-rate control valve 28 while controlling its flow rate, by opening the first solenoid valve 24 to the second flow-rate control valve 28 side while maintaining the second solenoid valve 25 in the closed state. As a result, the rubber sheet 10 is deflated at a low speed, and the tape 11, the wafer 9 and the tape frame 12 are thereby lowered slowly (step S6 in FIG. 5). As described above, the flow rate of nitrogen supplied to the first airtight space 7 is controlled by using the second flow-rate control valve 28. This is because, by doing so, the fragile structure mounted on the wafer 9 is prevented from being broken due to the rapid movement of the nitrogen to the first airtight space 7.

Further, the low-speed deflation of the rubber sheet 10 is continued even after the tape frame 12 comes into contact with the press ring 18, and the rubber sheet 10 is thereby removed gently from the under surface of the wafer 9. As a result, it is possible to prevent any large tensile load from being exerted on the wafer 9 when the rubber sheet 10 is removed.

(8) Rubber Flattening Process

Figure 14:
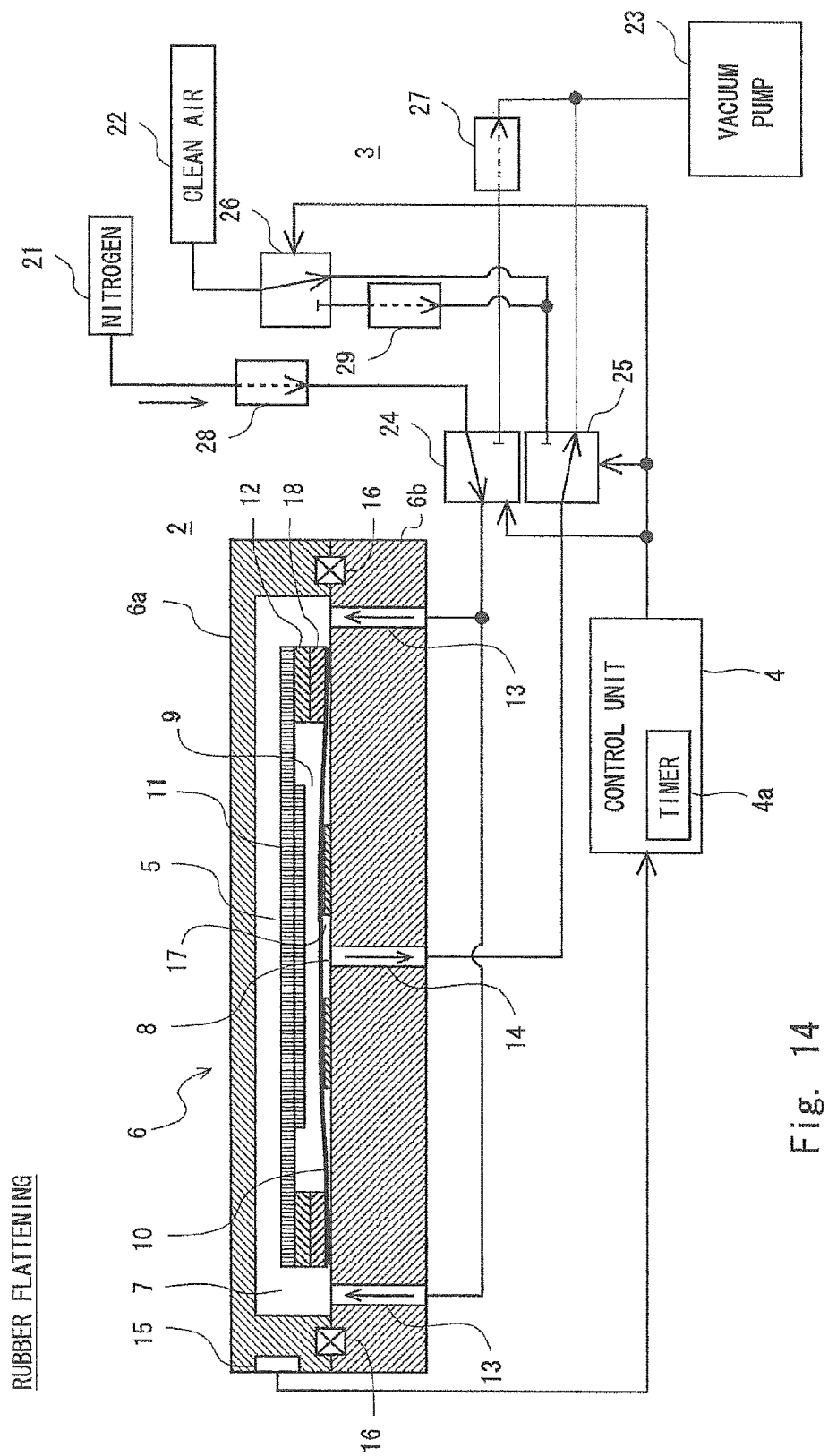
FIG. 14 is a flow diagram of a tape sticking process, and shows a rubber flattening process.

Next, as shown in FIG. 14, air is sucked from the second airtight space 8 by opening the second solenoid valve 25 to the vacuum pump 23 side. As a result, the rubber sheet 10 is deflated and thereby flattened at a high speed (step S7 in FIG. 5). Finally, the upper chamber 6a is opened and the tape 11 with the wafer 9 stuck thereon is taken out together with the tape frame 12, thus completing the tape sticking process.

Figure 20B:
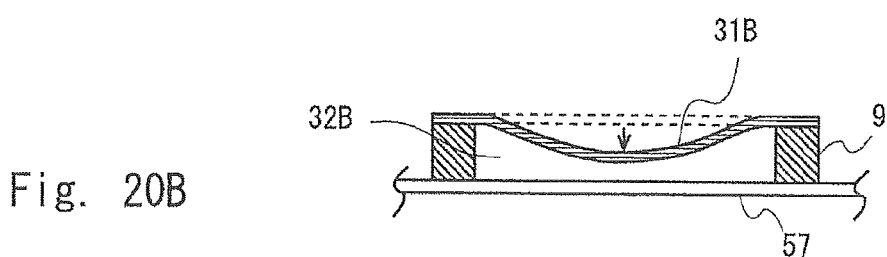
FIG. 20B is a rough diagram showing another example of an MEMS wafer.

Note that when the MEMS wafer shown in FIGS. 20A and 20B is used as the wafer 9, in the rubber deflation and flattening process shown in FIGS. 13 and 14, a pressure difference occurs between the airtight space 32B, which is formed by sticking the tape 11 on the wafer 9 through a series of tape sticking processes (FIGS. 9 to 12), and the first airtight space 7. Therefore, there is a risk that a load will be exerted on the thin-film 31B, which is a fragile structure, and thus the thin-film 31B may be broken.

However, in this exemplary embodiment, when the first airtight space 7 is depressurized in the evacuating process (FIG. 6), the vacuum level of the first airtight space 7 is controlled to such a vacuum level that the fragile structure is not broken. Therefore, the first airtight space can be pressurized without breaking the fragile structure.

Note that in the tape sticking apparatus 1, as shown in FIGS. 13A and 13B, a plurality of spacers 17, which are arranged in a cross-like configuration around the mouth of the second supply/exhaust pipe 14, are formed on the top surface of the lower chamber 6b. Therefore, it is possible to prevent air from remaining in the second airtight space 8 when the second airtight space 8 is brought into a depressurized atmosphere state.

Figure 15A:
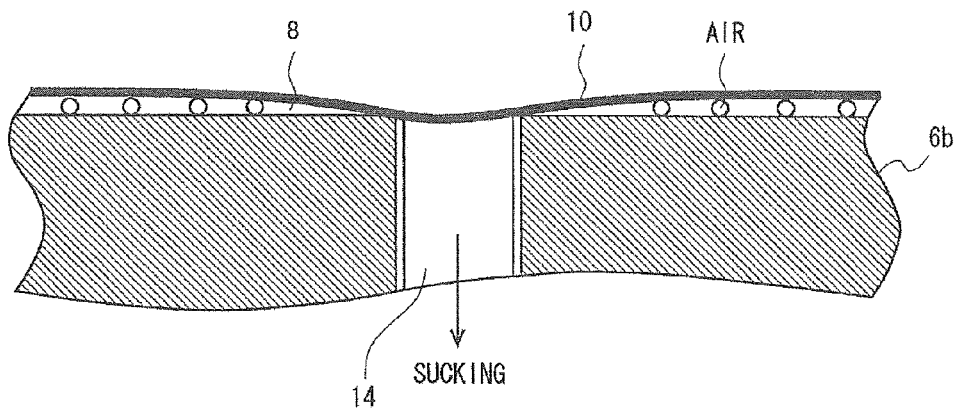
FIG. 15A is a rough schematic diagram for explaining an operation and effect of a spacer shown in FIG. 4, and shows a case where the spacer is not provided.

That is, if the spacers 17 are not provided, as shown in FIG. 15A, the rubber sheet 10 is sucked into the second supply/exhaust pipe 14 and the mouth of the second supply/exhaust pipe 14 is blocked up when air is sucked through the second supply/exhaust pipe 14. As a result, air can no longer be sucked from the second airtight space 8, and thus air remains in the second airtight space 8

Figure 5:
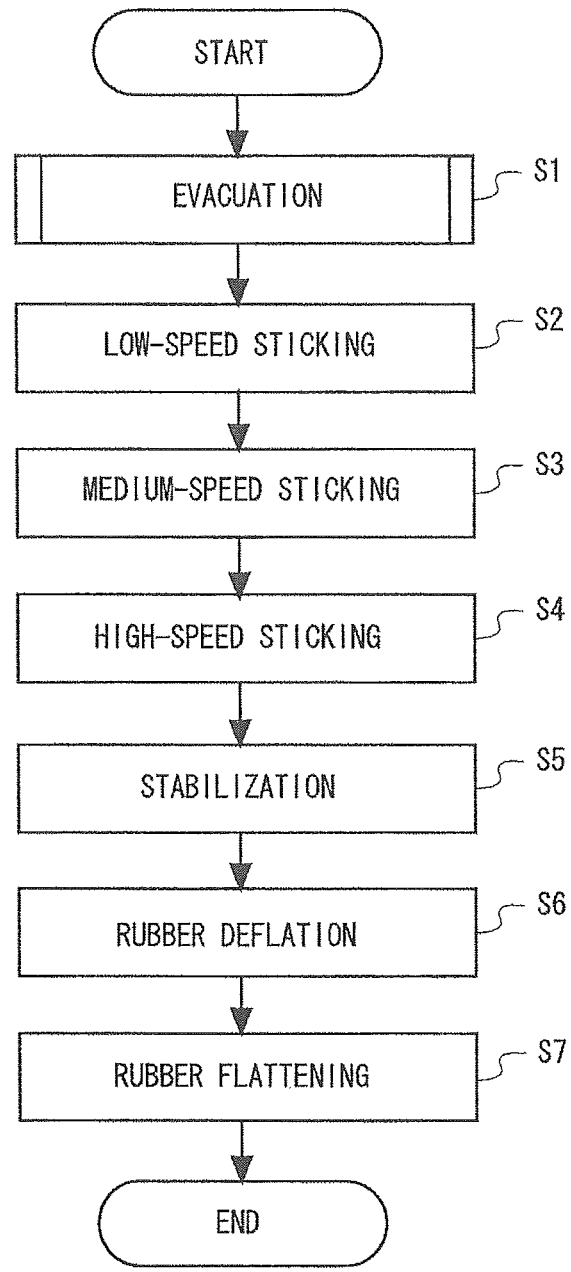
FIG. 5 is a main flowchart showing a procedure of a tape sticking method using a tape sticking apparatus shown in FIG. 1.
Figure 6:
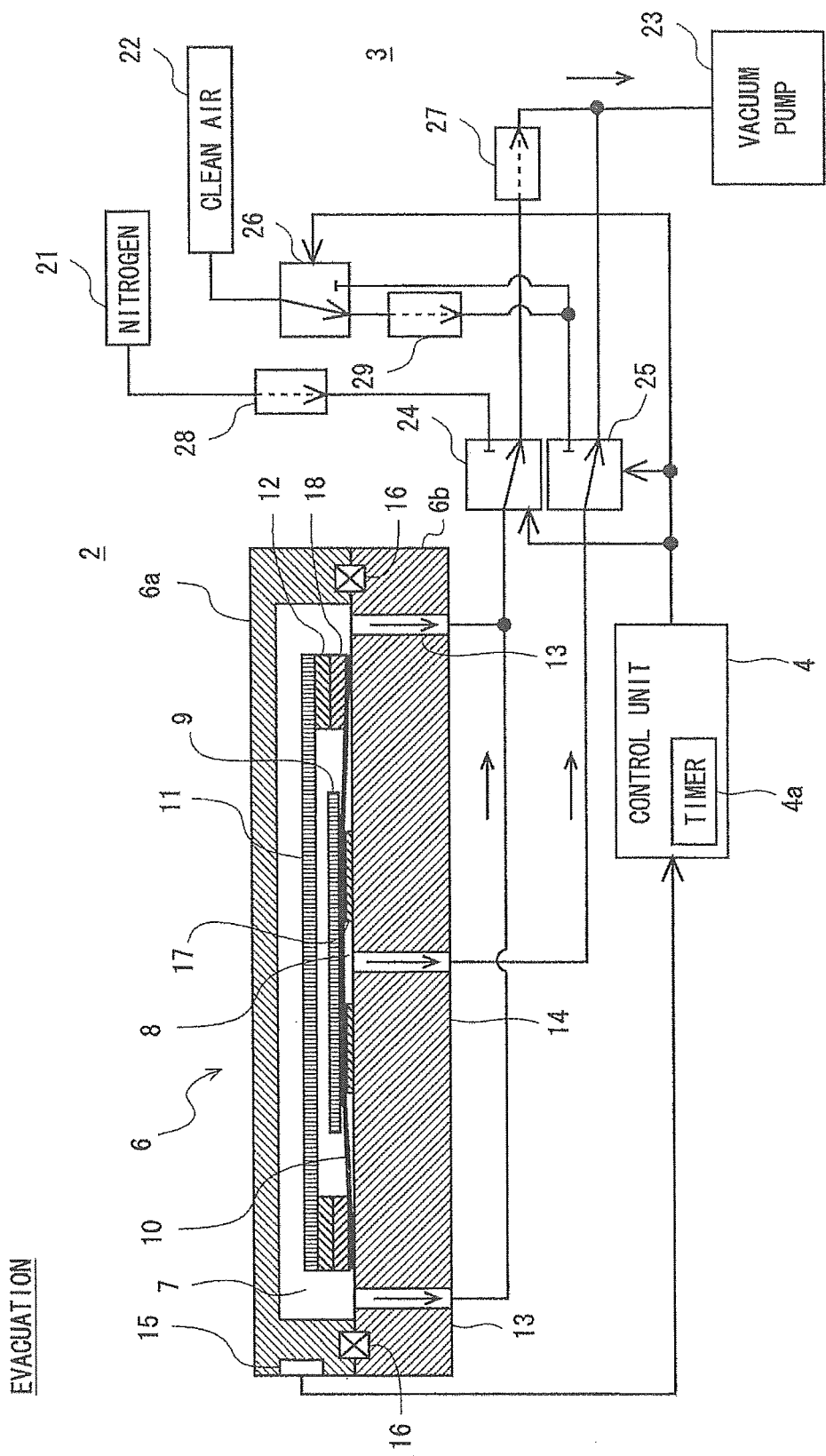
FIG. 6 is a flow diagram of a tape sticking process, and shows an evacuating process.

If the situation like this occurs, for example, in the evacuating process in the step S1 in FIG. 5, the second airtight space 8 has a positive pressure with respect to the first airtight space 7, thus preventing the rubber sheet 10 from being completely flattened. Further, the second airtight space 8 has a positive pressure with respect to the first airtight space 7 as described above. Therefore, if the process moves to the low-speed sticking process in the step S2 in FIG. 5 in that state, the rubber sheet 10 starts to inflate at a relatively high speed at the moment when the sucking of air from the second airtight space 8 is stopped. Consequently, the wafer 9 is pushed upward at a speed high than the desired speed. A similar situation also occurs when the process moves to the medium-speed sticking process in the step S3 in FIG. 5, thus making the appropriate control of the pressing pressure of the wafer 9 to the tape 11 impossible.

Figure 15B:
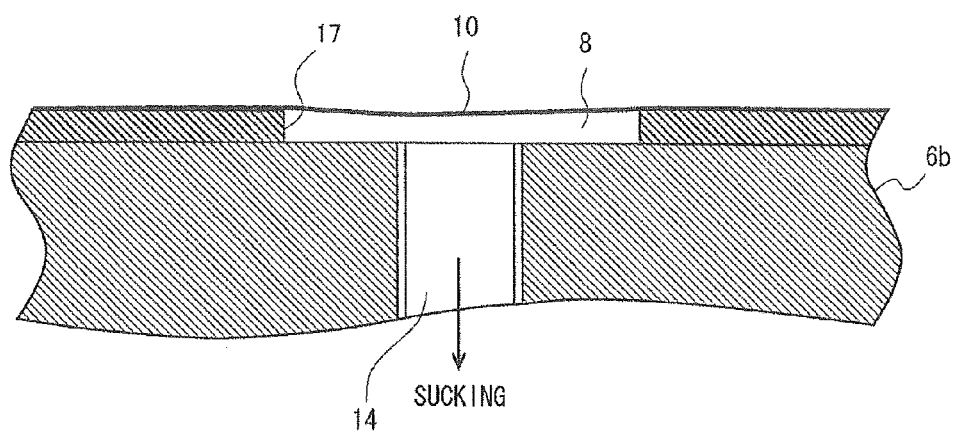
FIG. 15B is a rough diagram for explaining an operation and effect of a spacer shown in FIG. 4, and shows a case where the spacer is provided.

In contrast to this, when the spacers 17 are provided, as shown in FIG. 15B, even when air is sucked through the second supply/exhaust pipe 14, the rubber sheet 10 comes into contact with the spacers 17, thereby preventing the rubber sheet 10 from being sucked into the second supply/exhaust pipe 14. In this state, the air of the second airtight space 8 flows into the second supply/exhaust pipe 14 through the spaces between neighboring spacers 17. Therefore, the spacers 17 do not hinder the air from being sucked from the second airtight space 8.

By providing the spacers 17 as described above, it is possible to prevent air from remaining in the second airtight space 8 in the evacuating process in the step S1 in FIG. 5. Therefore, it is possible to appropriately control the pushing-up speed of the wafer 9 and the pressing pressure of the wafer 9 to the tape 11 in the subsequent steps S2 and S3.

Note that there are no particular restrictions on the height of the spacers 17. That is, the height of the spacers 17 may be determined as appropriate according to the air sucking pressure from the second airtight space 8 and/or the material of the rubber sheet 10. Further, the configuration of the spacers 17 is not limited to the cross-like configuration. For example, other configurations such as a radial configuration around the mouth of the second supply/exhaust pipe 14 may also be employed. Further, a plurality of spacers 17 may be scattered around the mouth of the second supply/exhaust pipe 14 without having any particular regularity.

Figure 16:
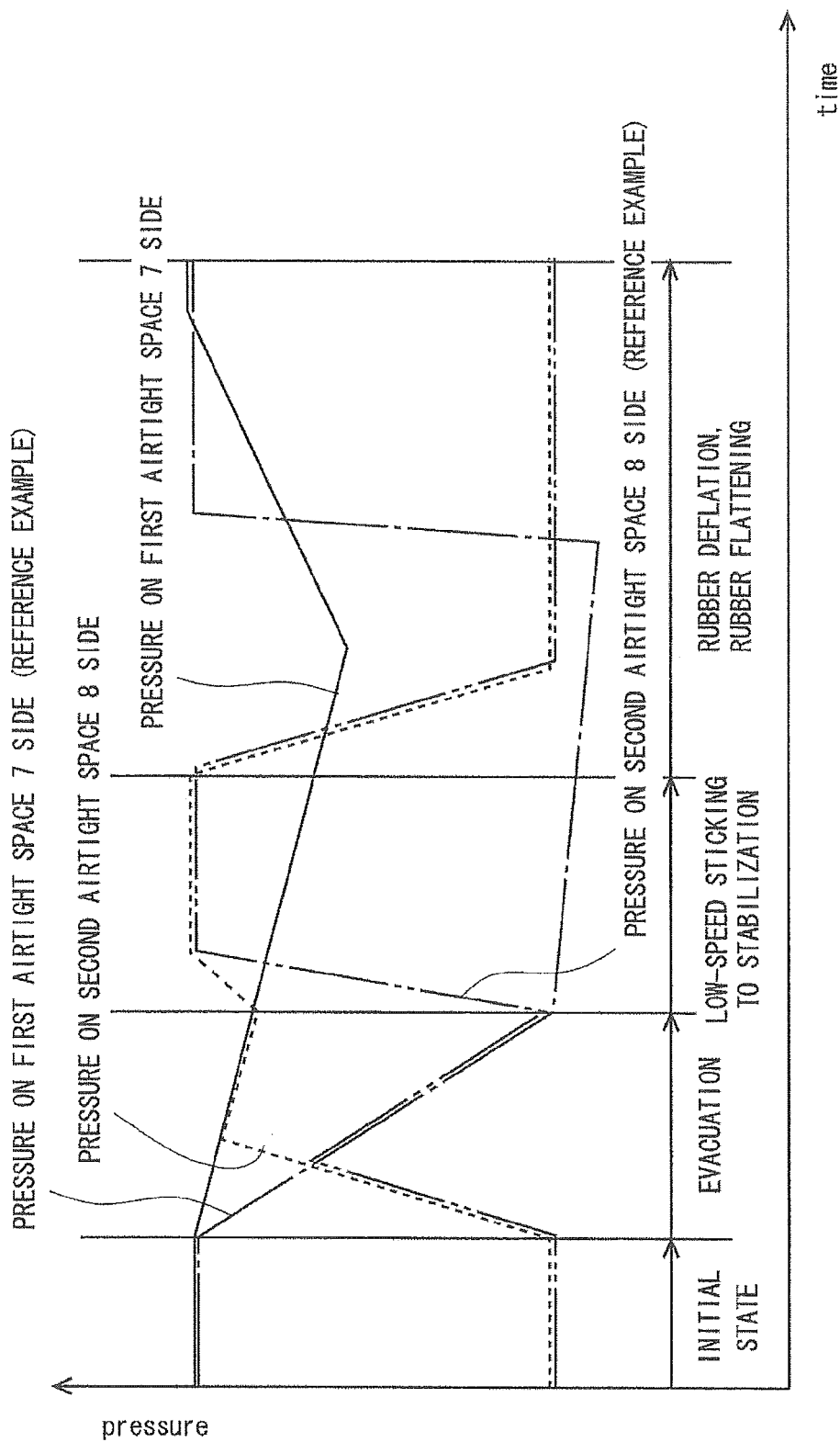
FIG. 16 is a rough diagram showing pressure changes in first and second airtight spaces.
Figure 17:
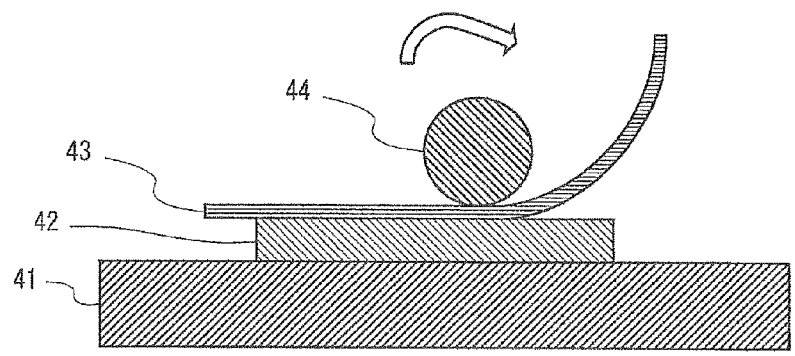
FIG. 17 is a rough diagram showing an example of a tape sticking method in related art.
Figure 18:
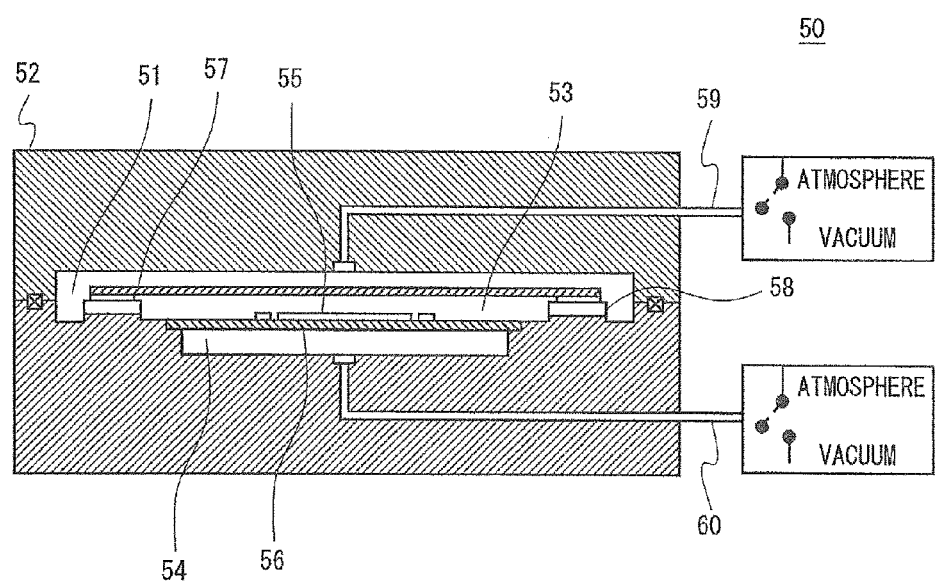
FIG. 18 is a rough diagram showing another example of a tape sticking method in related art.

FIG. 16 shows changes of the pressurized states of the first and second airtight spaces 7 and 8 in respective processes shown in FIGS. 1, 6 and 9 to 14. Note that changes of the pressurized states in a case where the first and second flow-rate control valves 27 and 28 are not used are also shown as a reference example in FIG. 6, so that the changes of the pressurized states in the tape sticking apparatus 1 according to this exemplary embodiment are shown more definitely.

Firstly, in the initial state shown in FIG. 1, since the upper chamber 6a is opened when the wafer 9 is placed above the rubber sheet 10, the pressure of the first airtight space 7 becomes substantially equal to the atmospheric pressure. Further, the pressure of the second airtight space 8 is reduced by the air sucking performed by the vacuum pump 23, and thus becomes a predetermined pressure.

Next, in the evacuating process shown in FIG. 6, the air of the first airtight space 7 is sucked by the vacuum pump 23 with its flow rate being controlled by the first flow-rate control valve 27. Therefore, the first airtight space 7 is depressurized in a lower speed in comparison to the depressurizing speed in the reference example.

Next, in the slow-speed sticking process to the stabilization process shown in FIGS. 9 to 12, the air or the like in the first airtight space 7 continues to be sucked at the same flow rate as that in the evacuating process. Therefore, the first airtight space 7 is continuously depressurized slowly at the same depressurizing speed as that of the evacuating process.

Note that the depressurizing of the first airtight space 7 is carried out in such a manner that the vacuum level of the first airtight space 7 does not exceed a predetermined vacuum level that is determined according to the resistance to pressure or the like of the fragile structure mounted in the wafer 9. At this point, the pressure of the first airtight space 7 becomes a pressure extremely close to the atmospheric pressure (e.g., 50000 to 100000 Pa).

Further, the second airtight space 8 is pressurized by the air supply caused by the natural leakage in the low-speed sticking process and by the air supply from the air supply source 22 in the medium-speed and high-speed sticking processes. As a result, the pressure of the second airtight space 8 becomes substantially equal to the atmospheric pressure.

Next, in the rubber deflation process and the rubber flattening process shown in FIGS. 13 and 14, nitrogen is supplied to the first airtight space 7 with its flow rate being controlled by the second flow-rate control valve 28. Therefore, the first airtight space 7 is pressurized at a lower speed in comparison to the pressurizing speed of the reference example.

As described above, according to this exemplary embodiment, in the evacuating process that is performed before the tape 11 is stuck on the wafer 9, the air of the first airtight space 7 is sucked with its flow rate being controlled by the first flow-rate control valve 27 and the first airtight space 7 is thereby slowly depressurized. Therefore, it is possible to prevent the fragile structure mounted on the wafer 9 from being broken due to the air movement of the first airtight space 7.

Further, according to this exemplary embodiment, in the rubber deflation and flattening process that is performed after the tape 11 is stuck on the wafer 9, nitrogen is supplied to the first airtight space 7 with its flow rate being controlled by the second flow-rate control valve 28 and the first airtight space 7 is thereby slowly pressurized. Therefore, it is possible to prevent the fragile structure mounted on the wafer 9 from being broken due to the air movement of the first airtight space 7.

Further, according to this exemplary embodiment, the depressurizing of the first airtight space 7 is performed until the first airtight space 7 has a predetermined vacuum level that is defined in advance. Therefore, it is possible to prevent the fragile structure mounted on the wafer 9 from being broken due to the pressure difference caused by the vacuum-level difference between the airtight space 32A that is formed in the wafer 9 in advance and the first airtight space 7 when the first airtight space 7 is depressurized in the evacuating process. Further, it is possible to prevent the fragile structure mounted on the wafer 9 from being broken due to the pressure difference caused by the vacuum-level difference between the airtight space 32B that is formed in the wafer 9 in the tape sticking process and the first airtight space 7 when the first airtight space 7 is pressurized in the rubber deflation and flattening process.

Although exemplary embodiments according to the present invention have been explained above, the present invention is not limited to the above-described configurations. That is, various modifications can be made to those configurations without departing from the scope of the present invention specified in the claims.

For example, although examples in which a tape sticking apparatus according to the present invention is applied to cases where dicing tape is stuck on a semiconductor wafer are shown in the above-described exemplary embodiments, the present invention can also be widely applied to cases other than the examples shown above in the exemplary embodiments, such as a case where protection tape is stuck on a glass plate, provided that the tape is stuck on a sticking target object having low rigidity.

Further, the wafer 9 is stuck on the tape 11 while switching the sticking speed among three speeds, i.e., the low-speed, the medium-speed and the high-speed in the above-described exemplary embodiments. However, when the wafer 9 has a sufficient thickness and/or the rubber sheet 10 is made of non-slippery material, the low-speed sticking process may be omitted and the tape sticking process may be started from the medium-speed sticking process.

Further, although the rubber sheet 10 is slowly inflated by using the natural leakage on the second airtight space 8 side in the low-speed sticking process in the above-described exemplary embodiments, the natural leakage does not necessarily have to be used. That is, the inflating speed of the rubber sheet 10 may be lowered in the low-speed sticking process by supplying a smaller amount of air to the second airtight space 8 than the amount of air supplied in the medium-speed sticking process.

Further, although the nitrogen supply source 21 and the air supply source 22 are provided as supply sources for supplying gases to the first and second airtight spaces 7 and 8 in the above-described exemplary embodiments, any gases other than nitrogen and air with which the first and second airtight spaces 7 and 8 can be pressurized and depressurized can also be used as the gases supplied to the first and second airtight spaces 7 and 8.

Further, although the apparatus main body 2, the rubber sheet 10, and the tape frame 12 are formed in a cylindrical shape, a circular shape, and a ring shape respectively to conform their shapes with a typical shape of a semiconductor wafer in the above-described exemplary embodiments, the shapes of the apparatus main body 2 and the like are not limited to these shapes. For example, other shapes such as a rectangular shape can be adopted.

Further, although a common port(s) is used for both the supply port for supplying gas and the suction port for sucking gas for each of the first and second airtight spaces 7 and 8 in the above-described exemplary embodiments, these ports may be separately provided.

This application is based upon and claims the benefit of priority from Japanese patent application No. 2011-147018, filed on Jul. 1, 2011, the disclosure of which is incorporated herein in its entirety by reference.

REFERENCE SIGNS LIST

1 TAPE STICKING APPARATUS
2 APPARATUS MAIN BODY
3 SUPPLY/EXHAUST MECHANISM
4 CONTROL UNIT
4a TIMER
5 AIRTIGHT SPACE
6 CHAMBER
6a UPPER CHAMBER
6b LOWER CHAMBER
7 FIRST AIRTIGHT SPACE
7a INNER SPACE
7b OUTER SPACE
8 SECOND AIRTIGHT SPACE
9 WAFER
10 RUBBER SHEET
11 TAPE
12 TAPE FRAME
13 FIRST SUPPLY/EXHAUST PIPE
14 SECOND SUPPLY/EXHAUST PIPE
14a MESH CAP
15 VACUUM-LEVEL SENSOR
16 SEAL RING
17 SPACER
18 PRESS RING
19 GROOVE
21 NITROGEN SUPPLY SOURCE
22 AIR SUPPLY SOURCE
23 VACUUM PUMP
24 FIRST SOLENOID VALVE
25 SECOND SOLENOID VALVE
26 THIRD SOLENOID VALVE
27 FIRST FLOW-RATE CONTROL VALVE
28 SECOND FLOW-RATE CONTROL VALVE
29 THIRD FLOW-RATE CONTROL VALVE
31(31A, 31B) THIN-FILM
32(32A, 32B) AIRTIGHT SPACE

The invention claimed is:

1. A tape sticking apparatus, comprising:
a vessel with an airtight space formed therein;
an elastic sheet that partitions the airtight space into an upper-located first airtight space and a lower-located second airtight space, a tape sticking target object being placed in the first airtight space side;
a tape hold member that holds a tape inside the first airtight space and positions the tape a predetermined distance away from the tape sticking target object placed on the elastic sheet; and
an air-pressure switching member for switching between pressurizing and depressurizing by supplying or sucking gas to or from the first and second airtight spaces;
a first supply/exhaust pipe that supplies air to the first airtight space and sucks air from the first airtight space;
a second supply/exhaust pipe that supplies air to the second airtight space and sucks air from the second airtight space; and
a plurality of spacers having a predetermined height and being formed on a top surface of a lower vessel of the vessel in the second airtight space located below the elastic sheet,
wherein the first and second supply/exhaust pipes are laid inside the lower vessel,
wherein the spacers are arranged around a mouth of the second supply/exhaust pipe,
wherein, the tape sticking apparatus is configured that, after the first and second airtight spaces are depressurized and thereby evacuated, the tape sticking target object is stuck on the tape by pressurizing the second airtight space, inflating the elastic sheet, and pushing the tape sticking target object upward, and the elastic sheet is deflated by pressurizing the first airtight space,
wherein the air-pressure switching member comprises:
a first flow-rate controller which, when gas is sucked from the first airtight space, controls a flow rate of the gas; and
a second flow-rate controller which, when gas is supplied to the first airtight space, controls a flow rate of the gas, and
wherein, when the first airtight space is depressurized, the gas is sucked from the first airtight space while controlling its flow rate by using the first flow-rate controller, and when the first airtight space is pressurized, the gas is supplied to the first airtight space while controlling its flow rate by using the second flow-rate controller.

2. The tape sticking apparatus according to claim 1, further comprising a vacuum-level detector for detecting a vacuum level of the first airtight space,
wherein the first airtight space is depressurized until the vacuum level of the first airtight space reaches a predetermined vacuum level.

3. The tape sticking apparatus according to claim 2, wherein a first internal airtight space is formed in the tape sticking target object, and
wherein the predetermined vacuum level is such a vacuum level that the tape sticking target object is not broken due to a pressure difference between the first internal airtight space and the first airtight space caused by the depressurizing of the first airtight space.

4. The tape sticking apparatus according to claim 2, wherein a second internal airtight space is formed in the tape sticking target object by the sticking of the tape, and the predetermined vacuum level is such a vacuum level that the tape sticking target object is not broken due to a pressure difference between the second internal airtight space and the first airtight space caused by the pressurizing of the first airtight space.

5. The tape sticking apparatus according to claim 1, wherein the tape sticking target object is stuck on the tape while controlling an amount of the pressurization of the second airtight space thereby changing an inflating speed of the elastic sheet from a low speed to a high speed in a stepwise manner when the tape sticking target object is pushed upward.

6. The tape sticking apparatus according to claim 5, wherein the elastic sheet is inflated at a first speed until a contact area between the tape sticking target object and the tape reaches a predetermined size, and after that, the inflating speed of the elastic sheet is switched to a second speed higher than the first speed and an entire sticking surface of the tape sticking target object is brought into contact with the tape, the first speed being such a speed that the tape sticking target object can be pressed on the tape with a pressing pressure with which the tape sticking target object is not broken.

7. The tape sticking apparatus according to claim 6, wherein before the elastic sheet is inflated at the first speed, the elastic sheet is inflated at a third speed lower than the first speed and a central part of the tape sticking target object is brought into contact with the tape.

8. The tape sticking apparatus according to claim 7, wherein the elastic sheet is inflated at the third speed by evacuating the first and second airtight spaces and then blocking up the second supply/exhaust pipe while maintaining the first airtight space in the evacuated state.

9. The tape sticking apparatus according to claim 6, wherein when the elastic sheet is inflated at the second speed, the tape sticking target object and the tape are pushed upward and thereby pressed against a ceiling surface of the airtight space while maintaining the tape sticking target object and the tape in contact with each other.

10. The tape sticking apparatus according to claim 1, wherein a mesh cap including a plurality of holes is provided in an opening of the second supply/exhaust pipe.

11. The tape sticking apparatus according to claim 1, wherein the elastic sheet includes an elastic body comprising chloroprene rubber and ethylene-propylene rubber.

12. The tape sticking apparatus according to claim 1, wherein the spacers are arranged in a cross configuration around the mouth of the second supply/exhaust pipe.

13. The tape sticking apparatus according to claim 1, wherein the elastic sheet is placed on the top surface of the lower vessel.

14. The tape sticking apparatus according to claim 1, wherein the spacers include a material similar to a material of the elastic sheet.

15. The tape sticking apparatus according to claim 1, wherein a press ring having a ring shape, as viewed from a top, is placed above a periphery of the elastic sheet.

16. The tape sticking apparatus according to claim 15, wherein a plurality of grooves are foamed in the press ring, and a space inside the press ring is connected with a space outside the press ring through the grooves.

17. The tape sticking apparatus according to claim 15, wherein a tape frame having the ring shape, as viewed from a top, is placed on a top surface of the press ring.

18. The tape sticking apparatus according to claim 17, wherein the tape is disposed on a top surface of the tape frame.

19. The tape sticking apparatus according to claim 18, wherein the tape sticking tarket objected comprises a wafer disposed on a top surface of the elastic sheet.

20. The tape sticking apparatus according to claim 19, wherein the wafer comprises a recessed section and a film that covers the recessed section.

* * * * *